United States Patent
Akimoto

(10) Patent No.: US 6,815,719 B2
(45) Date of Patent: Nov. 9, 2004

(54) FIELD EFFECT TRANSISTOR AND IMAGE DISPLAY APPARATUS USING THE SAME

(75) Inventor: Hajime Akimoto, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/955,275

(22) Filed: Sep. 19, 2001

(65) Prior Publication Data

US 2002/0117689 A1 Aug. 29, 2002

(30) Foreign Application Priority Data

Feb. 28, 2001 (JP) ........................................ 2001-054932

(51) Int. Cl.$^7$ ............................................. H01L 29/78
(52) U.S. Cl. ........................... 257/72; 257/66; 257/365; 257/912
(58) Field of Search ........................... 257/66, 72, 365, 257/912

(56) References Cited

U.S. PATENT DOCUMENTS

| | | | | |
|---|---|---|---|---|
| 4,223,329 A | * | 9/1980 | Jambotkar | 257/912 |
| 5,124,769 A | * | 6/1992 | Tanaka et al. | 257/66 |
| 5,714,771 A | * | 2/1998 | Misawa et al. | 257/66 |
| 6,166,786 A | * | 12/2000 | Ohkubo et al. | 257/72 |
| 6,274,888 B1 | * | 8/2001 | Suzuki et al. | 257/66 |
| 6,288,413 B1 | * | 9/2001 | Kamiura et al. | 257/66 |
| 6,384,427 B1 | * | 5/2002 | Yamazaki et al. | 257/72 |

OTHER PUBLICATIONS

N. Ibaraki, "Low–Temperature Poly–Si TFT Technology", and Y. Aoki, "A 10.4–in. XGA Low–Temperature Poly–Si TFT–LCD for Mobile PC Applications", SID 99 Digest of Technical Papers, pp. 172–179.

Y. Nakajima, et al., "A 3.8–inch QVGA Reflective Color LCD with Integrated 3b DAC Driver", IEEE International Solid–State Circuits Conference, Feb. 8, 2000, pp. 188–189.

* cited by examiner

*Primary Examiner*—Gene M. Munson
(74) *Attorney, Agent, or Firm*—Antonelli, Terry, Stout & Kraus, LLP

(57) ABSTRACT

A field effect transistor includes an n$^+$ high-density impurity injection area, a p$^+$ high-density impurity injection area, an i-impurity non-injection area, and a gate electrode. The gate electrode is free from completely lapping over the i-impurity non-injection area, but laps over substantially half the i-impurity non-injection area adjacent to the n$^+$ high-density impurity injection area so as to avoid channel carrier capture levels due to crystal defects/grain boundaries and an effect of potential barriers due to the channel carrier capture levels.

18 Claims, 13 Drawing Sheets

PLAN VIEW

CROSS SECTION

PLAN VIEW

CROSS SECTION

PLAN VIEW

CROSS SECTION

WHEN NO CARRIER CAPTURE LEVELS
ARE PRESENT(IDEAL CASE)

WHEN CARRIER CAPTURE LEVELS
ARE PRESENT(ACTUAL CASE)

FIELD EFFECT TRANSISTOR AND IMAGE DISPLAY APPARATUS USING THE SAME

BACKGROUND OF THE INVENTION

1. Field of the Invention

The present invention relates to field effect transistors and image display apparatus using the same, and more particularly to a field effect transistor operable at low voltages and image display apparatus capable of displaying an image at low power consumption.

2. Description of the Related Art

Recently, the advancement of liquid crystal display apparatus has been remarkable and thin display apparatus have rapidly diffused in place of CRTs (Cathode Ray Tubes) as the display devices that have been prevalent so far. As personal computers (PCs), digital video discs (DVDs), and digital television broadcasts have diffused, the thin display apparatus have been required to present a high-speed response and high-definition display. TFT liquid crystal display panels have been known as liquid crystal display devices capable of meeting such requirement in the past.

Referring to FIG. 19, one example of the conventional TFT liquid crystal display panels will be described. The panel illustrated is provided on a glass substrate 210 as an example. Pixels 201 each having a liquid crystal capacitance 204 are arranged in the form of a matrix on the glass substrate 210 wherein the pixels arranged in the respective rows are connected via corresponding gate lines 205 to a gate line driver 206 and the pixels arranged in the respective columns are connected via corresponding signal lines 207 to a signal line driver 208.

For simplifying purposes, only four pixels 201 are illustrated. The liquid crystal capacitance points to a liquid crystal unit element (cell), which can be regarded equivalently as static capacitance. Thus, this name is used. In each pixel 201, the liquid crystal capacitance 204 is connected via series-connected pixel TFTs (Thin Film Transistors) 202 and 203 to an associated signal line 207.

The signal line driver 208 is connected to a signal input line 209 that receives a signal voltage externally. The respective pixel TFTs 202 and 203, and the gate and signal line drivers 206 and 208 each comprise a polysilicon TFT.

Operation of the TFT liquid crystal display panel will be described next. The signal line driver 208 sequentially distributes the signal voltage received via the signal input line 209 to the respective signal lines 207.

The gate line driver 206 sequentially drives the respective gate lines 205 to open/close the respective pairs of pixel TFTs 202 and 203 in the rows corresponding to the gate lines 205, so that the respective signal voltages outputted by the signal driver 208 to the corresponding signal lines 207 are delivered to the liquid crystal capacitance 204 of the respective pixels 201 concerned.

The signal voltage inputted to each liquid crystal capacitance 204 of its pixel modulates the optical characteristic of the liquid crystal capacitance of the pixel. As a result, an image depending on the inputted signal voltage is displayed on the TFT liquid crystal display panel.

The TFT liquid crystal display panels of this type are detailed, for example, "SID 99, Digest of Technical Papers", pp. 172–179 (1999). This technique, however, fails to allow for TFTs that operate at low voltages, so that image display apparatus of low power consumption are difficult to realize because the conventional TFTs are difficult to drive at low voltages.

The problems with the TFTs will be described next with reference to FIGS. 20A–20C, which are a cross-sectional view of the conventional n-channel TFT, an ideal potential and current-voltage characteristic representation of the n-channel TFT having no carrier capture levels, and a real potential and current-voltage characteristic representation having carrier capture levels, respectively.

As shown in FIG. 20A, the TFT has a source area composed of an $n^+$ higher density impurity injection area 221 and an $n^-$ lower density impurity injection area 222; a drain area composed of an $n^+$ higher-density impurity injection area 223 and an lower $n^-$ impurity injection area 224; a channel forming area including an impurity non-injection area 225 designated by i and a gate electrode 220.

Thus, the TFT basically comprises a MOSFET (insulated gate-type field effect transistor). The reference character i-attached to the impurity non-injection area represents a so-called intrinsic semiconductor.

FIGS. 20A–20C omit representation of an insulating layer present between the gate electrode 220 and the i-impurity non-injection area 225, and other insulators formed in other areas for convenience of simplicity.

The operation of the TFT will be described next. At the beginning, for convenience of explanation, an ideal TFT having no channel carrier capture levels in its channel forming area 225 unlike the conventional TFT will be explained.

As shown in FIG. 20B illustrating potentials, in the ideal TFT electrons $e^-$ injected from the source electrode 226 diffuse along a channel 228 to the drain electrode 227 and drift to form a channel current.

The gate voltage Vgs to channel current Ids characteristic in this case is shown rightward in FIG. 20B. In this Figure, when there is no stray capacitance in the channel an area called a tailing area shown by a double-headed arrow has a 60 mV/figure current value characteristic as a theoretical limit ($kT/q \cdot \ln 10 = 60$ mV where k is Bolzman constant, T is temperature, and q is a unit charge quantity).

This implies that the amplitude of the gate voltage necessary for controlling, for example, a current value of five figures does not need more than 300 mV.

Since the essence of the explanation is not influenced in FIGS. 20B and 20C, the higher and lower impurity injection areas shown by $n^+$ and $n^-$, respectively, are not shown distinguishably in the potential representation.

In the case of a real conventional TFT having a channel forming area 225 of polycrystal silicon, there are many channel carrier capture levels due to crystal defects and grain boundaries in the channel forming area 226 as the actual problem. Next, the operation of this TFT will be described.

Thus, as shown in FIG. 20C channel carriers 231 captured by those capture levels form many potential barriers 230 in the channel to thereby hinder diffusion and drifting of the channel current.

Since the channel carrier capture levels are present in band gaps in the Si-more channel carriers are captured as a higher positive gate voltage is applied to the gate of the TFT to thereby further grow the potential barriers 230. In other words, as a higher positive voltage is applied to the gate of the TFT, a threshold voltage Vth of the TFT rises higher.

As a result, as shown by the gate voltage Vgs to channel current Ids characteristic right in FIG. 20C, the tailing area portion shown by the double-headed arrow has a considerably flattened characteristic with a gradient of 200 mV/figure current or more. When the gradient is, for example, "300 mV/figure current", this value implies that the amplitude of the gate voltage necessary for control of a current, for example, of five figures requires 1500 mV.

In addition, in the actual case where there are actually channel carrier capture levels, the growth of the potential barriers 230 increases an apparent threshold voltage Vth to thereby greatly decrease the channel current itself corresponding to the same gate voltage. As a result, a drive voltage required to drive the circuit increase greatly.

As the actual problem, generally a 10–15 V drive voltage is required to maintain a stabilized operation of the conventional TFT having the channel forming area 225 of polycrystal silicon. That is, the operational voltage of the TFT is so high that a reduction in the power consumption in the low-voltage drive is difficult. Although the above description was made with reference to the n-channel TFT, the same applies to the p-channel TFT.

SUMMERY OF THE INVENTION

It is therefore an object of the present invention to provide a field effect transistor that operates sufficiently at low voltages.

Another object of the present invention is to provide an image display apparatus that requires small power consumption.

In order to achieve the above objects, according to the present invention there is provided an insulated gate field effect transistor having a gate electrode in a channel area between a first and second source areas thereof, wherein the channel area comprises an area portion free from lapping over the gate electrode in plan.

The channel area may be made of a polycrystal silicon film. The area portion of the channel area free from lapping over the gate electrode in plan may have a length longer than a crystal grain size of the polycrystal silicon that composes the channel area.

The channel area may be made of an intrinsic semiconductor. The area portion of the channel area may contain injected impurities of less than $1\ e^-18/cm^3$.

The gate electrode may be provided on an opposite side of a substrate, which holds the channel area, from the channel area. The gate electrode may be provided between the channel area and the substrate that holds the channel area.

At least a part of the gate electrode may lap over one of the first and second source areas in plan.

Likewise, according to the present invention the above objects are achieved by an insulated gate type field effect transistor having a gate electrode in a channel area between a first and a second source area thereof, wherein the gate electrode comprises two separate subgate electrodes disposed on the respective sides of the first and second source areas in a direction in which the channel area extends.

In this transistor the channel area may be made of an intrinsic semiconductor. The area portion of the channel area may contain injected impurities of less than $1\ e^-18/cm^3$.

In addition, according to the present invention the above objects are also achieved by a double field effect transistor device of an insulated gate type, comprising a channel area taking a virtually I-type form in plan; a first pair of source areas different in conductive type respectively formed at opposite ends of one of a pair of parallel strips that composes a part of the I-shape; a second pair of source areas different in conductive type respectively formed at opposite ends of the other of the pair of parallel strips that composes a part of the I-shape so that the source areas formed respectively at the ends of the pair of parallel strips extending in the same direction are different in conductive type; and a gate electrode lapping over an area of the I-shape that comprises the central portions of the pair of parallel strips that composes a part of the I-shape and a central link of the I-shape that combines the pair of parallel strips.

In this device the channel area may be made of an intrinsic semiconductor. The area portion of the channel area may contain injected impurities of less than $1\ e^-18/cm^3$.

Likewise, according to the present invention the above objects are achieved by an image display apparatus comprising a display unit of a plurality of pixels formed on an insulating substrate, and a controller formed on the insulating substrate for at least processing a display signal and for writing the display signal to the display unit, wherein at least part of the controller comprises any one of the field effect transistors mentioned above.

Furthermore, according to the present invention the above objects are achieved by an image display apparatus comprising a display unit of a plurality of pixels formed on an insulating substrate, and a controller formed on the insulating substrate for at least processing a display signal and for writing the display signal to the display unit, wherein at least part of the controller comprises any one of the field effect transistors mentioned above and wherein an image control device of the display unit comprises any one of the other field effect transistors mentioned above.

DETAILED DESCRIPTION OF THE EMBODIMENTS

Embodiments of the inventive field effect transistor and liquid crystal display apparatus will be described in detail with reference to the accompanying drawings.

<First Embodiment>

Figure 1A:
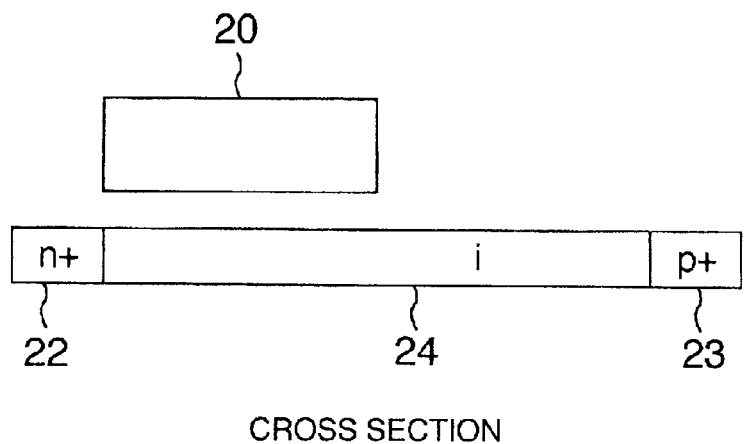
FIGS. 1A and 1B illustrate a first embodiment of a bipolar TFT according to the present invention.
Figure 1B:
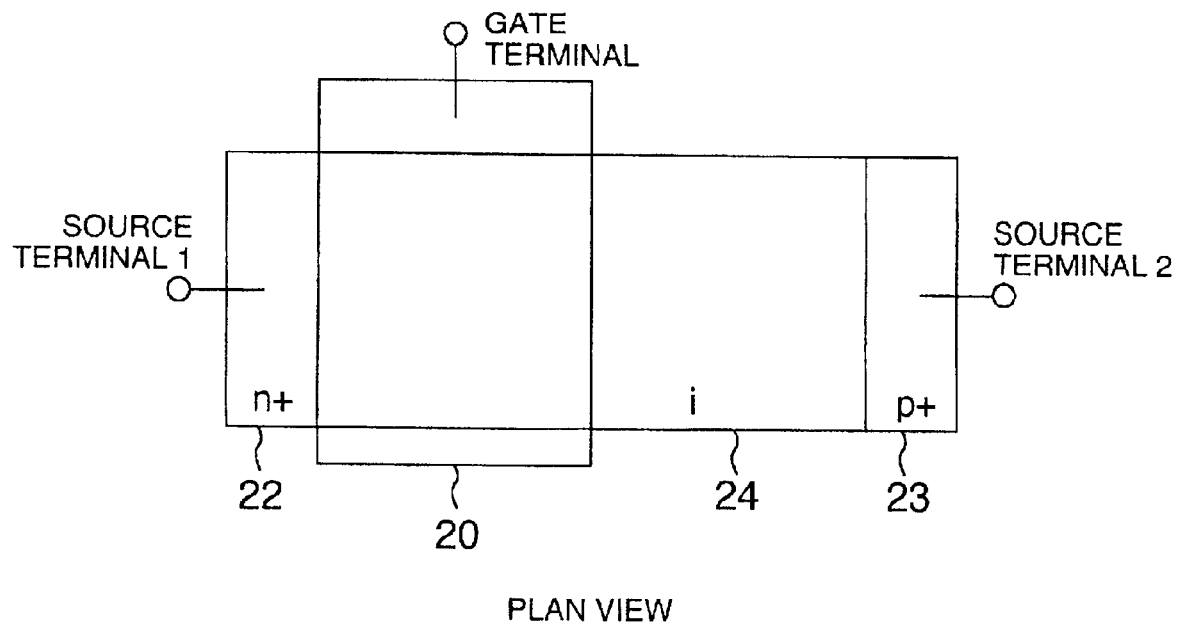
Figure 2:
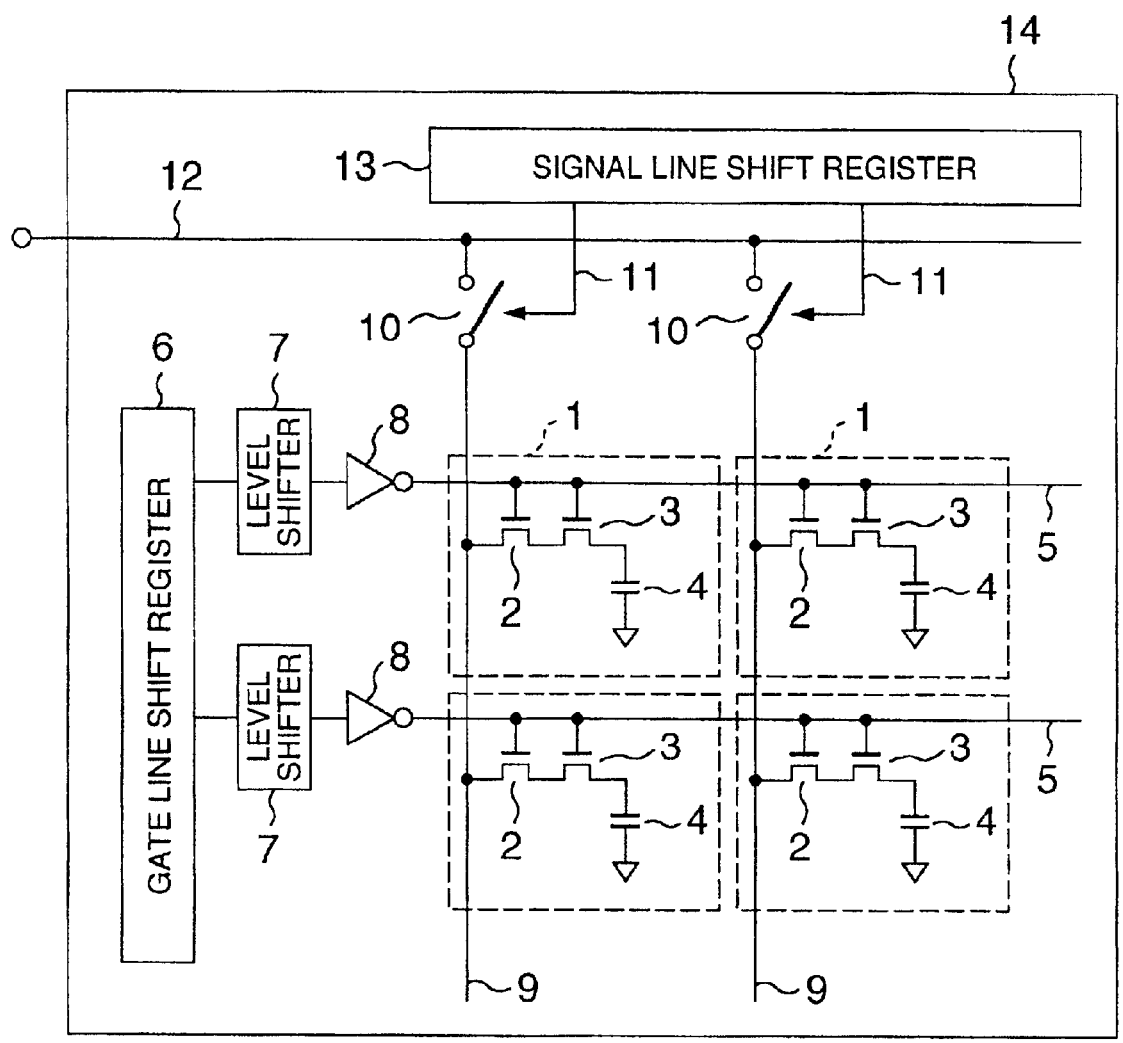
FIG. 2 is a schematic of one embodiment of an image display apparatus according to the present invention.

Referring to FIGS. 1–9, a first embodiment of the present invention will be described. As shown in FIG. 2, a polysilicon TFT liquid crystal display panel of this embodiment comprises a glass substrate 14 on which pixels 1 each having liquid crystal capacitance 4 are arranged in the form of a matrix (for convenience of simplification, only four pixels are illustrated).

The liquid crystal capacitance 4 of each pixel 1 is connected to an associated signal line 9 via two pixel TFTs 2 and 3 whose source and drain electrodes are connected in series and whose gate electrodes are connected together to an associated gate line 5.

The respective pixels 1 in a row are connected in parallel with the associated gate line 5, which is, in turn, connected via a corresponding gate line buffer 8 and a gate line level shifter 7 to a gate line shift register 6.

The respective pixels in a column are connected in parallel with the corresponding signal line 9, which is, in turn, connected via a corresponding signal line switch 10 to a signal line 12. At this time, the signal line switch 10 is connected via a corresponding shift register output line 11 by a signal line shift register 13.

Operation of this embodiment will be described next. First, the signal line shift register 13 sequentially scans the signal line switches 10 via the corresponding shift register output lines 11 to distribute signal voltages inputted through the signal line 12 to the corresponding respective signal lines 9.

The gate line shift register 6 sequentially scans the gate lines 5 via the respective gate line level shifters 7 and gate line buffers 8 to open/close the pixel TFTs 2 and 3 in the corresponding pixel rows and applies signal voltages outputted on the respective signal lines 9 to the associated liquid crystal capacitance 4 in the respective pixels 1.

The signal voltages inputted to the liquid crystal capacitance 4 modulate the corresponding optical characteristics of the liquid crystals of the respective pixels 1. As a result, the whole display panel displays an image depending on the input signal voltages.

By arranging an optical reflective electrode to a respective one of the pixels, a so-called reflective display type liquid crystal display apparatus is provided which is capable of displaying an image using only external environmental light without using internal illumination such as back or front light.

According to this embodiment, a low drive voltage, for example, of 5 V is used and hence the power consumption is greatly reduced because the gate line shift register 6, the gate line level shifters 7, the signal shift register 13 and the signal switches 10 employ low-voltage drive field effect transistors which will be described below.

FIGS. 1A and 1B illustrate one embodiment of the inventive low voltage drive EFT that comprises a first source area composed of an $n^+$ high-density impurity injection area 22, a second source area composed of a $p^+$ high-density impurity injection area 23, a channel forming area composed of an impurity non-injection area 24 designated by i- and a gate electrode 20, as shown in a cross-sectional view of FIG. 1A.

Also, FIG. 1A omits representation of insulators (for example, $SiO_2$ and $Si_3N_4$) formed between the gate electrode 20 and the i-area 24, and in other areas, and the glass substrate 14 provided below the insulators for convenience of simplification in the Figures.

In this transistor shown in a plan view of FIG. 1B, the gate electrode 20 is not provided so as to completely lap over the whole area of the i-impurity non-injection area 24 in plan, but substantially laps only over a left half of the area 24 so as to be adjacent to the $n^+$ high-density impurity injection area 22.

The $n^+$ area 22 as the first source area has a source terminal 1 whereas the $p^+$ area 23 as the second source area has the other source terminal 2. One of those source areas is used as a drain area depending on an aspect of its use.

The gate electrode 20 has a width which is equal to half the length of the i-impurity non-injection area 24 and is about 4 $\mu$m distant from the $p^+$ area 23. The $n^+$ and $p^+$ areas 22 and 23, and the i-area 24 are each composed of a thin polycrystal silicon film. The i-area 24 is composed of a thin polycrystal silicon film having a thickness 50 nm and a crystal grain size of about 0.5 $\mu$m.

As will be obvious from the above composition, the low-voltage drive FET of this embodiment can also be fabricated easily in a process similar to that used to produce the conventional polycrystal silicon TFTs. Thus, the inventive transistors can be formed easily on the same substrate as the conventional polycrystal silicon TFTs.

Figure 3A:
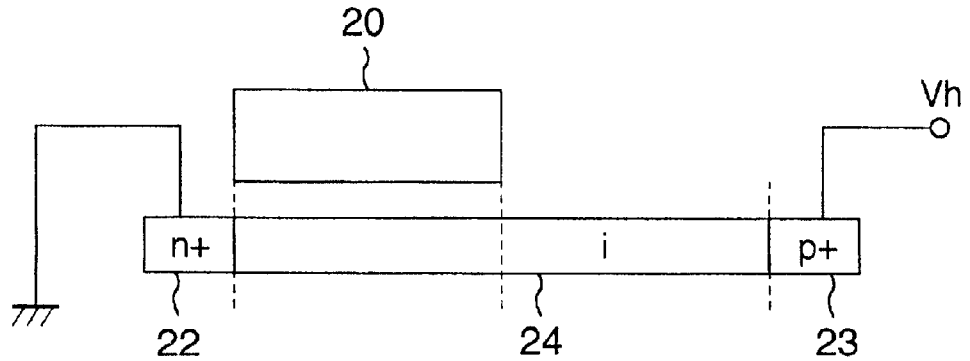
FIGS. 3A, 3B and 3C illustrate operation of the first embodiment of the bipolar TFT according to the present invention.
Figure 3B:
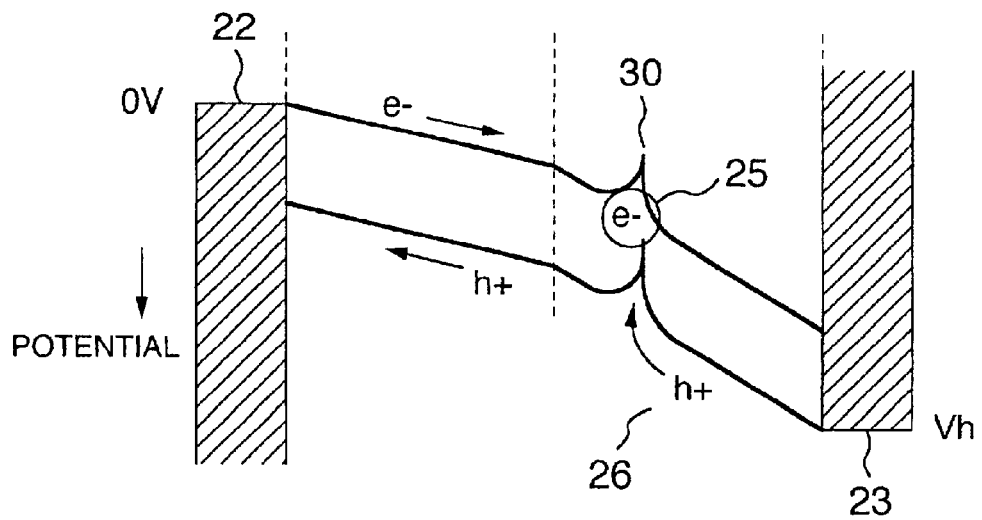
Figure 3C:
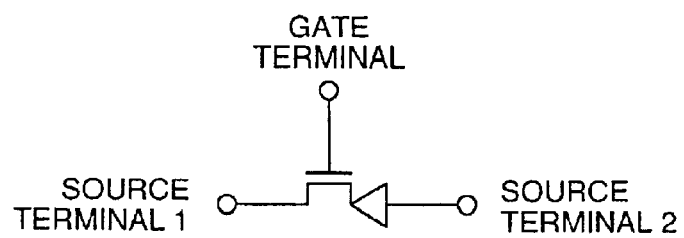

Referring to FIGS. 3A–3C, operation of the low voltage drive FET of the embodiment will be described. As shown in FIGS. 3A and 3C, if the $n^+$ high-density impurity injection area 22 to which the source terminal 1 is connected is grounded and the $p^+$ high-density impurity injection area 23 to which the source terminal 2 is connected is supplied with a voltage Vh, channel carriers or electrons are injected from the $n^+$ area 22 to the i-area 24.

Also, in this embodiment the i-impurity non-injection area 24 as the channel forming area is made of polycrystal silicon as in the conventional case, so that there are many channel carrier capture levels due to crystal defects/grain boundaries in the channel forming area.

Thus, as shown in FIG. 3B, electrons $e^-$ or channel carriers injected into the i-impurity non-injection area 24 are easily captured in the capture levels.

The electrons 25 captured by the capture levels form many potential barriers 30 throughout the i-area 24, also including its portion underlying the gate electrode 20.

At this time, however, part of the injected electrons reach from the $n^+$ area 22 to the right-hand end of the gate electrode 20 to lower the potential of the gate electrode 20 to thereby induce injection of holes $h^+$ from the $p^+$ area 23 to which the source terminal 2 is connected.

As viewed from the newly injected holes 26, the capture levels that have captured electrons $e^-$ are charged negative. Thus, their capture cross-sections are very large. Thus, the capture levels each function as a center of re-combination having a very short life.

The life of the center of re-combination is far short compared to the life of the capture level that has captured a simple electron. Thus, the channel carrier capture levels as viewed from electrons are screened. As a result, the potential barriers 30 produced by the channel carrier capture levels 25 that captured electrons can be regarded equivalently as having become extinct.

Although the channel carrier capture levels capture the newly injected holes as carriers similarly, the capture cross-section of each of the capture levels that have captured the holes is very large and functions as a center of re-combination having a very short life because the capture levels that have captured the holes are charged positive.

Thus, the channel carrier capture levels as viewed from the holes are screened in a similar mechanism, and the potential barriers that are produced by the channel carrier capture levels that have captured the holes can be regarded equivalently as having become extinct.

As a result, according to the low voltage drive FET (field effect transistor) shown in FIGS. 1A, 1B, and 3A, 3B, 3C, it will be seen that the influence of the channel carrier capture levels due to the crystal defects/grain boundaries and the resulting potential barriers 30 is avoided.

Since the electrons and holes mutually screen the potential barriers due to the channel carrier capture levels in the low voltage drive FET, there is little resistance parasitic in the i-impurity non-injection area 24, and this influence is negligible.

Thus, in this FET, a gate voltage Vgs-channel current Ids characteristic of less than 100 mV/figure current can be obtained easily.

Since in this embodiment no increase in the threshold voltage Vth due to the growth of the potential barriers 30 occurs even when the gate voltage is increased, a sufficient output current is ensured with a drive of a low voltage of 5 V.

A second embodiment of the inventive low-voltage drive FET will be described next. For convenience of explanation, the inventive low-voltage drive FET will be referred to as a "bipolar TFT" and will be expressed as a symbol shown in FIG. 3C. This derives from the features of this FET having a $n^+$ and a $p^+$ bipolar source.

In the embodiment of the bipolar TFT of FIGS. 3A–3C, the channel current is controlled by the magnitude of the voltage applied to the date electrode 20 from the gate terminal relative to the voltage of the source terminal 1 that is the low voltage terminal of the bipolar TFT.

According to the present invention, however, a bipolar TFT whose channel current is controlled by the voltage applied to the gate terminal relative to the voltage of the source terminal 2 as a higher voltage terminal can be realized in a similar composition. This TFT will be described as the second embodiment of the bipolar TFT of the present invention with reference to FIGS. 4A–4C.

Figure 4A:
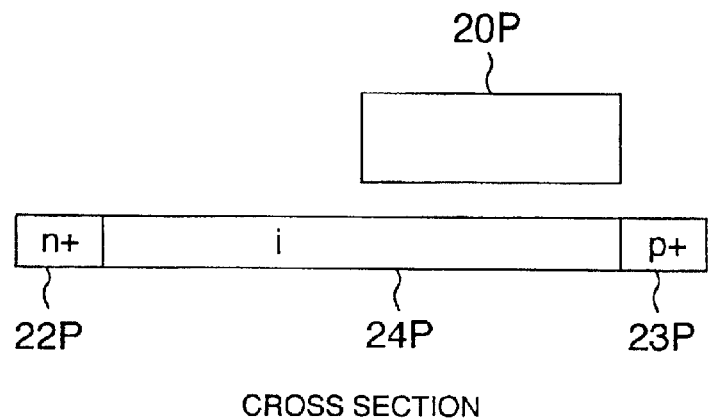
FIGS. 4A, 4B and 4C illustrate operation of a second embodiment of the bipolar TFT according to the present invention.
Figure 4B:
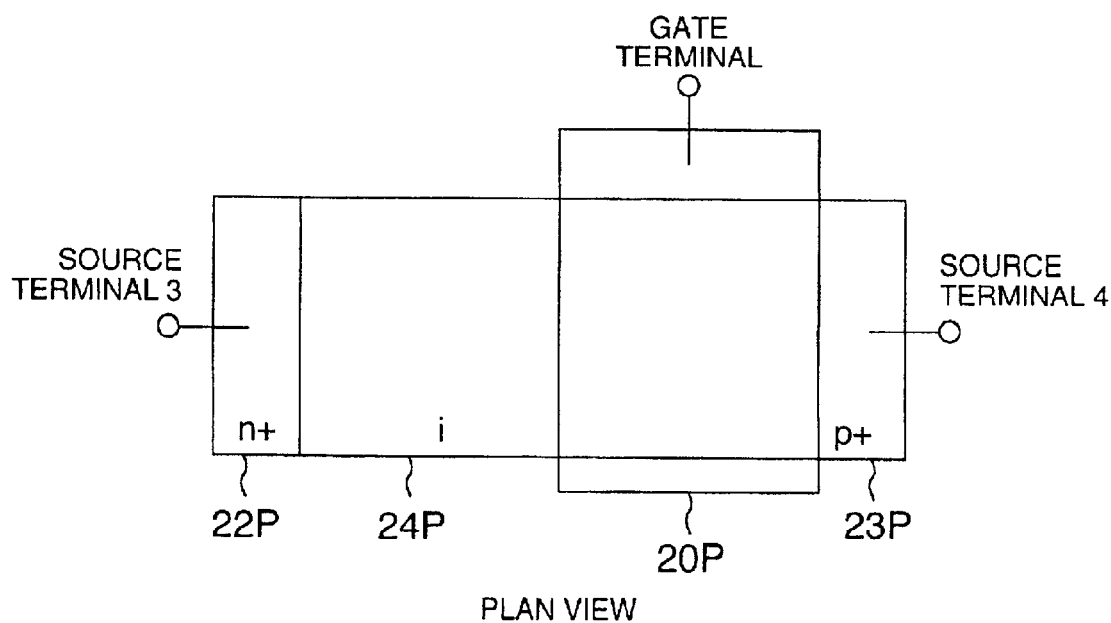

As shown in FIGS. 4A and 4B, which are a cross-sectional view and a plan view, respectively, of the bipolar TFT of the second embodiment, this TFT comprises a third area composed of an $n^+$ high-density impurity injection area 22p, a fourth area composed of a $p^+$ high-density impurity injection area 23p, a channel forming area composed of an i-impurity injection area 24p, and a gate electrode 20p.

Source terminals 3 and 4 are connected to the third and fourth source areas, respectively.

Also, this embodiment omits representation of insulators ($SiO_2$ and $Si_3N_4$) formed between the gate electrode 20p and the i-area 24p and in other areas to simplify the Figure representation.

The bipolar TFT of the second embodiment is greatly different from the first embodiment of FIGS. 1A and 1B in that the position of the gate electrode 20p that laps over the i-impurity non-injection area 24p is opposite to the position of that of the latter embodiment with respect to the midpoint of the i-area 24p.

More particularly, as show in FIGS. 4A and 4B, in the second embodiment the gate electrode 20p is disposed so as to lap over the right-hand half of the i-impurity non-injection area 24 adjacent to the fourth source area that comprises the $p^+$ high-density impurity injection area 23p.

Also, in this case the gate electrode 20p is about 4 $\mu$m distant from the $n^+$ high-density impurity injection area 22p having the source terminal 3.

Figure 4C:
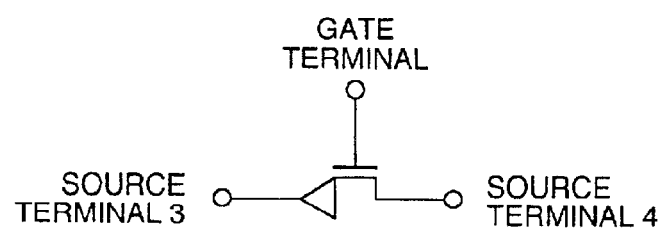

The bipolar TFT of the second embodiment will be expressed by a symbol in FIG. 4C. For convenience's sake, the bipolar TFTs of the first and second embodiments of FIGS. 3A–3C and 4A–4C will be expressed as an "n-channel" and a "p-channel" bipolar TFT, respectively, in the description below.

Operation of the bipolar TFT of the second embodiment shown in FIGS. 4A–4C is similar to that of the bipolar TFT of FIGS. 3A–3C if the $n^+$ and $p^+$ areas are exchanged; the electrons and holes are exchanged; and high and low potentials are exchanged. Thus, further description thereof will be omitted here.

A further embodiment of the present invention will be described next.

Figure 5:
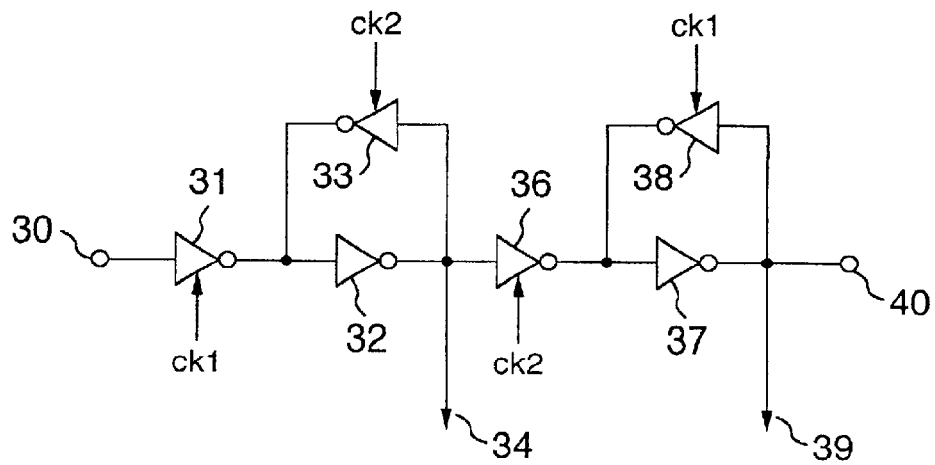
FIG. 5 is a schematic of a shift register unit as one embodiment of the present invention.

FIG. 5 is a schematic of one of unit elements that compose a shift register used in each of the gate and signal line shift registers 6 and 13 of the FIG. 2 embodiment. An input terminal 30 of this shift register unit is connected to an input of a clocked inverter 31 controlled by a first clock ck1. The clocked inverter points to an inverter whose operation is controlled by clock.

An output from the clocked inverter 31 is inputted to a first flip-flop composed of an inverter 32 and a clocked inverter 33 that is controlled by a second clock ck2. The output from the first flip-flop is connected to a first shift register output 34 and a clocked inverter 36 that is controlled by the clock ck2.

An output from the clocked inverter 36 is inputted to a second flip-flop composed of an inverter 37 and a clocked inverter 38 that is controlled by the clock ck1. An output from the second flip-flop is connected to a second shift register output 39 and an output terminal 40 of the unit element of the shift register. The clocks ck1 and ck2 are in complementary relationship where when one of the clocks ck1 and ck2 is at high level, the other is at low level.

Operation of the unit element of the shift register will be described next. It is basically the same as that of the conventional one. More particularly, when the clocked inverter 31 that is controlled by the first clock ck1 is turned on, the output from the immediately preceding shift register unit is delivered to the first flip-flop. When the clocked inverter 36 controlled by the second clock ck2 is turned on, a signal from the first flip-flop is delivered to the second flip-flop. This operation is repeated.

In the embodiment of FIG. 5, however, the inventive bipolar TFTs are used in the inverter and the clocked inverter unlike the conventional one, so that the embodiment is easily operable even at a low voltage of less than 5 V, which is a great feature of the embodiment.

Figure 6:
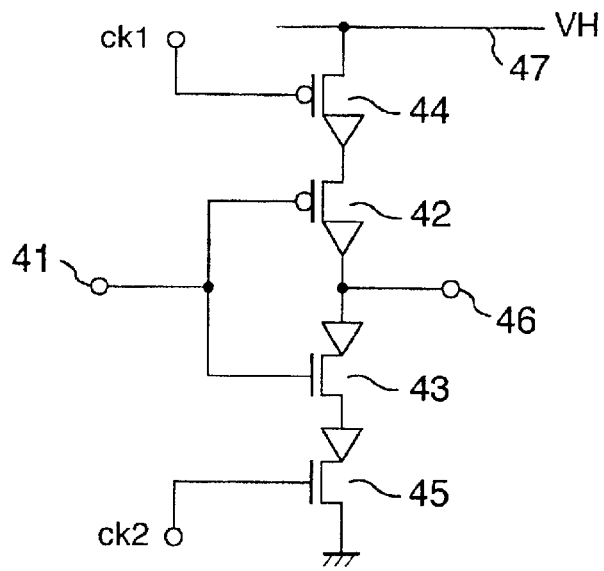
FIG. 6 is a schematic of a clock inverter as one embodiment of the present invention.

These circuits will be described more specifically. First, FIG. 6 is a schematic of each of clocked inverter 33 and 36 of the present embodiment. As shown, each of the clocked inverter 33 and 36 comprises two p-channel bipolar TFTs 44 and 42, and two n-channel bipolar TFTs 43 and 45 connected in series between a high voltage power supply (VH) 47 and ground so that a current can flow from the higher voltage side to ground.

An input terminal 41 is connected in common to both the gate electrodes of the p- and n-channel bipolar TFTs 42 and 43 whereas an output terminal 46 is connected in common to both the source terminals of the bipolar TFTs 42 and 43.

The first clock ck1 is delivered to the gate electrode of the p-channel bipolar TFT 44 whereas the second clock ck2 is delivered to the gate electrode of the n-channel bipolar TFT 45. Thus, first, when the first and second clocks ck1 and ck2 are at high and low levels, respectively, the bipolar TFTs 44 and 45 are turned off, and the circuit between both the source electrodes and hence the output terminal 46 are opened.

When the first and second clocks ck1 and ck2 are at low and high levels, respectively, the bipolar TFTs 44 and 45 are both turned on to thereby short-circuit the circuit between both the source electrodes.

In this case, when the voltage on the input terminal 41 becomes high, the n-TFT 43 becomes short-circuited and the p-TFT 42 becomes opened. Thus, the voltage on the output terminal 46 becomes low. Therefore, if the input terminal 41 becomes low, the n-TFT 43 becomes opened and the p-TFT 42 becomes short-circuited. Thus, the output terminal 46 becomes high. Thus, this embodiment acts as a clocked inverter.

The respective output voltages of the clocked inverter at clock levels "L" (low) and "H" (high) are determined by the ground voltage level and the voltage level of the power supply (VH) 47, so that this corresponds to operation of a CMOS clocked inverter. In this respect, in the present embodiment the high voltage of the power supply (VH) 47 was 5 V which was sufficient to operate this circuit.

While in FIG. 6 the clocked inverters 33 and 36 have been illustrated, operation of the clocked inverters 31 and 38 is similarly illustrated by exchanging the first and second clocks ck1 and ck2 with each other. Thus, further description thereof will be omitted here.

Figure 7:
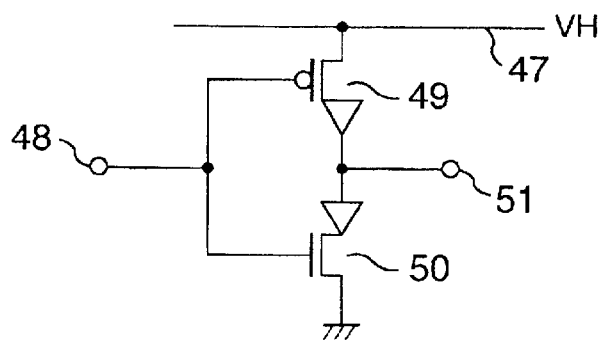
FIG. 7 is a schematic of an inverter as one embodiment of the present invention.

FIG. 7 is a schematic of each of the inverters 32 and 37 in which p- and n-channel bipolar TFTs 49 and 50 are connected in series between a high voltage power supply (VH) 47 and ground so that a current can flow from the high voltage side to ground.

An input terminal 48 is connected in common to both the gates of the p- and n-channel bipolar TFTs 49 and 50 whereas an output terminal 51 is connected in common to both the source electrodes of the TFTs 49 and 50.

Operation of the FIG. 7 inverter will be described next. Assume that the voltage of the input terminal 48 becomes high, the n-channel bipolar TFT 50 is short-circuited whereas the p-channel bipolar TFT 49 becomes opened. Thus, the voltage on the output terminal 51 becomes low.

When the voltage on the input terminal 48 voltage becomes low, the n- and p-channel bipolar TFTs 50 and 49 become opened and short-circuited, respectively. Thus, the voltage on the output terminal 51 becomes high, which means the inverter operation.

Also, here the low and high output voltages of the inverter are determined by the ground voltage level and the high voltage of the power supply (VH) 47, respectively, which corresponds to the operation of a CMOS inverter. In this respect, even when the voltage of the power supply (VH) 47 is 5 V, the inverter sufficiently operates, as described above.

Although in the above description the expression "the bipolar TFT becomes short-circuited" is used, this is somewhat inaccurate because when the bipolar TFT is turned on, it may be considered that the $p^+$ and $n^+$ high-density impurity areas between which the i-channel forming area is provided are rendered conductive in the forward direction, in which case the current-voltage characteristic of the bipolar TFT approximates the diode characteristic.

When the leak current flowing in the reverse direction through the diode approximated is small and the voltage across the bipolar TFT is zero, the on resistance of the TFT is large whereas when the reverse leak current is large and the voltage across the bipolar TFT is zero, the on resistance is small.

Actually, in the case of a diode having an intervening channel forming area of a 4 $\mu$m width as in the embodiment, the reverse leak current is small, for example, less than 1 PA/$\mu$m. Thus, when the voltage across the bipolar TFT is zero, its on resistance is large, so that it may be considered that the actual circuit output involves an output offset voltage of about 0.5 V.

Thus, in the embodiment the voltage between the source terminal 1 and the gate electrode of the n-channel bipolar TFT, and the threshold voltage Vth prescribed between the source terminal 4 and the gate electrode of the p-channel bipolar TFT are formed as 1.5 and −1.5 V, respectively, larger in absolute value than the output offset voltage to thereby turn off the next-stage bipolar TFTs fully.

Figure 8:
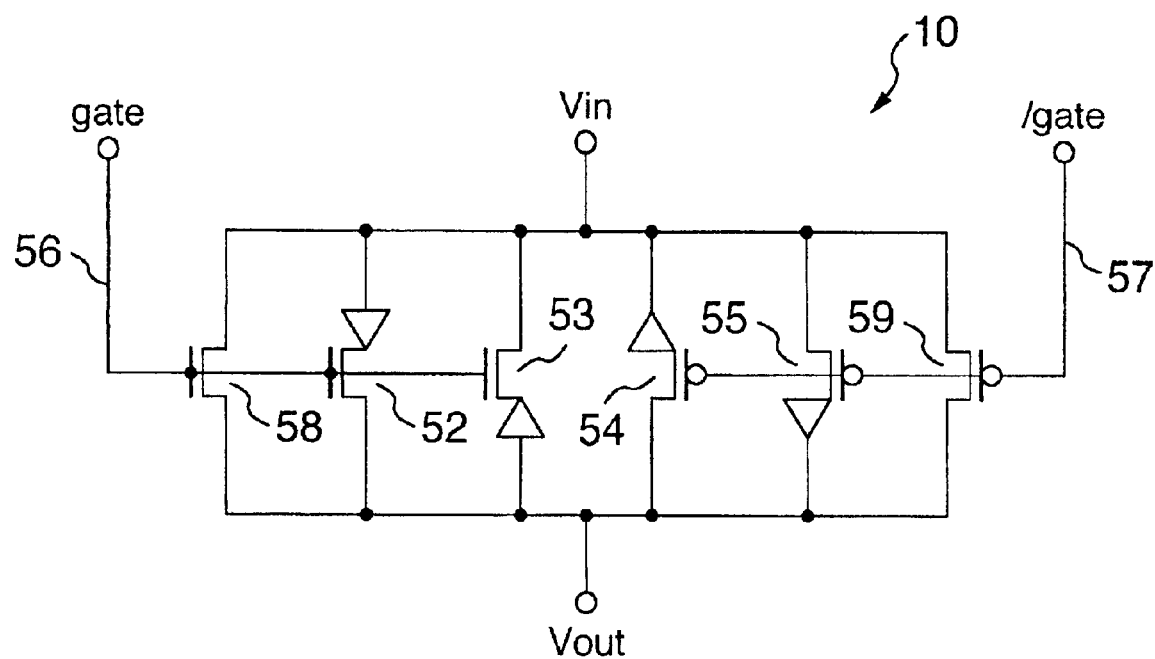
FIG. 8 is a schematic of a signal line switch as one embodiment of the present invention.

Referring to FIG. 8, an embodiment of the signal line switch 10 of the FIG. 2 image display apparatus will be described. As shown in FIG. 8, an n-channel TFT 58 and two n-channel bipolar TFTs 52 and 53 are connected in parallel between both terminals Vin and Vout of the signal line switch 10 wherein the two bipolar TFTs 52 and 53 are arranged in opposite directions. A signal line switch positive gate line 56 is connected in common to the gate electrodes of those TFTs.

In addition, in parallel with those TFTs a p-channel TFT 59 and two p-channel bipolar TFTs 54 and 55 are connected wherein the two TFTs 54 and 55 are connected in opposite directions with a signal line switch reverse gate line 57 being connected in common to the gate electrodes of the TFTs 59, 54 and 55.

Operation of the FIG. 8 signal line switch 10 will be described next. High and low voltage signals "H1" and "L1" inverted in level are applied to the signal line switch positive and reverse gate lines 56 and 57, respectively. The signal voltage "H1" is set so as to be higher than a voltage that appears between the input and output Vin and Vout. The signal voltage "L1" is set so as to be lower than the voltage that appears between the input and output Vin and Vout.

Assume now that "L1" and "H1" voltages are inputted to the gate lines 56 and 57, respectively. In this case, all the transistors are turned off and the circuit between the input and output Vin and Vout remains open or off.

Assume now that conversely, "H1" and "L1" voltages are inputted to the gate lines 56 and 57, respectively. In this case, all the transistors are turned on and the circuit between the input and output Vin and Vout is short-circuited. Thus, by the composition of FIG. 8 a switch function and hence the signal line switch 10 are obtained.

The six transistors used in this embodiment fulfill respective different roles. When the voltage between the input Vin and output Vout of the signal line switch 10 is high and low, respectively, the respective p- and n-channel transistors function differently. The polar TFTs connected in opposite directions are current driven in opposite directions.

When the voltages of the opposite sources of the bipolar TFT differ by more than 1 V, this TFT exhibits a large current drive capability whereas when they are substantially equal, the resistance across the TFT is large, as described above.

In order to avoid this situation in the embodiment of FIG. 8 the general TFTs 58 and 59 are connected in parallel and the bipolar TFTs mainly drive the current in the early writing period (the conduction start period) of the signal line switch 10 (FIG. 2). As the voltage across the input Vin and the output Vout comes to zero toward the end of the write operation (the conduction end period), the general TFT mainly drives the current.

Figure 9:
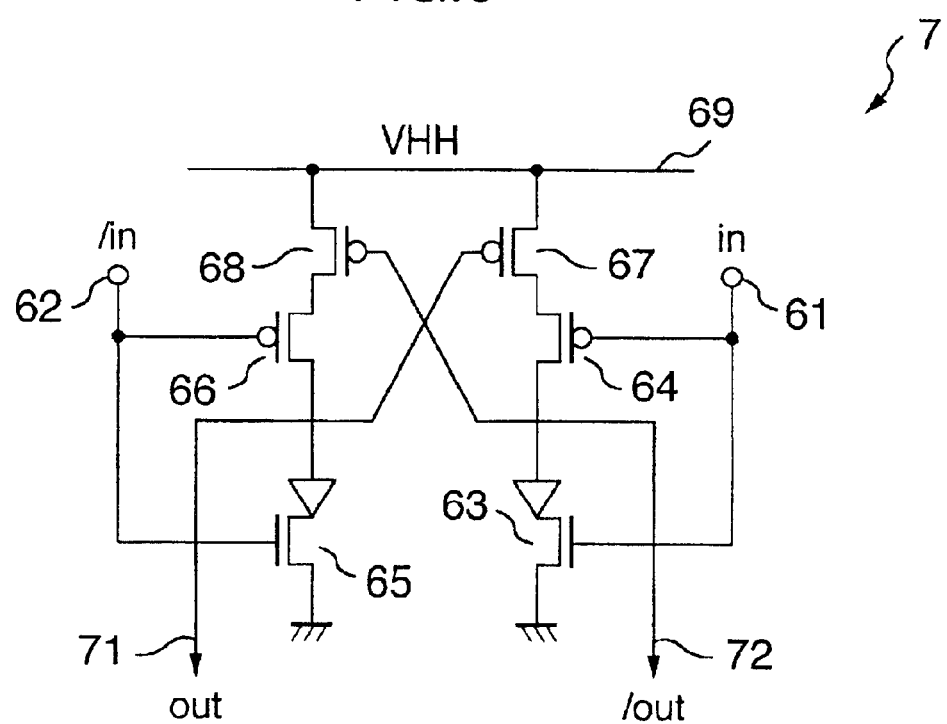
FIG. 9 is a schematic of a gate line level shifter as one embodiment of the present invention.

Referring to FIG. 9, an embodiment of the gate line level shifter 7 of the FIG. 2 display apparatus will be described. An input signal inverter composed of series connected p-channel TFTs 68 and 66 and n-channel bipolar TFT 65 is connected between a power supply line 69 to which a voltage VHH is applied and ground. An input signal inverter composed of series connected p-channel TFTs 67 and 64 and n-channel bipolar TFT 63 is also connected between the power supply line 69 and ground.

The junction point between the p-channel TFT 66 and n-channel bipolar TFT 65, and the junction point between the p-channel TFT 64 and n-channel bipolar TFT 63 are used as output terminals 71 and 72 of the respective input signal inverters connected to the corresponding gate electrodes of the p-channel TFTs 67 and 68.

The gate electrodes of the p- and n-channel TFTs 66 and 65 are connected together to an inverting input terminal 62 whereas the gate electrodes of the p- and n-channel TFTs 64 and 63 are connected together to a non-inverting input terminal 61.

Operation of the gate line level shifter of FIG. 9 will be described next. Signals "H" and "L" inverted mutually in level are inputted via the non-inverting and inverting input terminals 61 and 62, respectively, to the gate line level shifter 7 to thereby cause the two input signal inverters to output reverse signals.

When the n-channel bipolar TFT of one input signal inverter is on, its output is 0 V, which turns on the p-channel TFT of the other input signal inverter, so that its output voltage becomes VHH.

At this time, in this embodiment the voltages of the signals fed to the non-inverting and inverting input terminals 61 and 62 are 5 and 0 V, which will be inverted mutually, and the power supply voltage VHH is set to 10 V. Thus, the embodiment acts as a level shifter.

In this embodiment the current rise characteristics of the n-channel bipolar TFTs 63 and 65 are sharp satisfactorily. Thus, the gate line level shifter 7 can be operated with a low power supply voltage of 5 V.

Although in FIG. 9 the other p-channel TFTs can be replaced with the corresponding bipolar TFTs, this is not needed when the gate line level shifter 7 is driven at a low voltage of 5 V. The use of the p-channel TFTs has the advantage that an output amplitude of up to a maximum VHH is obtained.

If an increase in the circuit scale is permitted, the output amplitude can swing to its full limit to improve the output current by providing a p-channel bipolar TFT in parallel with the p-channel TFT, as will be obvious from the description of the signal line switch 10 of FIG. 8.

As described above, in the bipolar TFTs described so far the width of the i-area (the length of the current path) from the gate terminal to the source terminal 2 or 3 is set to 4 $\mu$m. As the width of the i-area decreases, the output current increases and the output resistance of the TFT decreases in the forward diode mode when the voltage across between both the current terminals approaches zero.

However, when the width of the i-area is narrower than the grain size of polycrystal silicon, the influence of the crystal grain boundary levels cannot be viewed. Thus, even if the voltage of the gate electrode is swung in the positive or negative direction, the current cannot be turned off. As a result, the circuit becomes equivalent to a pair of n- and p-channel TFTs connected in parallel that has no functions of the bipolar TFTs.

Thus, the off characteristic of the bipolar TFT is determined depending on the width of the i-area, which must therefore be determined carefully in consideration of deviations of an in-alignment mask in the manufacture. It is considered that the appropriate width of the i-area is about 1–6 $\mu$m in terms of the actual TFT process.

While in the embodiment the channel forming portion underlying the gate electrode of the bipolar TFT and the channel forming area portion adjacent to the gate electrode have been illustrated as being made of an intrinsic semiconductor, the threshold voltage Vth of the bipolar TFT can be controlled by injecting a small quantity of impurities of less than 1 e$^-$18/cm$^3$ into the i-channel forming area.

This is a general technique that is used in the control of the threshold voltage Vth in the conventional TFT, and therefore is equivalent to application of the technique to the bipolar TFT.

In the embodiment no application of the bipolar TFTs to the pixel TFTs 2 and 3 of the FIG. 2 display apparatus has been described. This is because a depleted portion of the i-area has an optical sensitivity that causes a photoelectric conversion current to change to an off-leak current. Thus, in the embodiment the peripheral circuit portions including the bipolar TFT are preferably shielded from light in order to prevent a wrong operation of the embodiment due to the incident light thereto.

In the present embodiment many changes and modifications are possible without departing from the spirit and scope of the present invention. For example, while the glass substrate 14 is used as the base for the panel, it may be replaced with a quartz or transparent plastic substrate. In the case of a reflective display, an opaque substrate may be used.

The embodiment does not dare to refer to the number of pixels and the panel size because it is not limited to their specifications and formats.

While in the embodiment the general TFTs and the inventive bipolar TFTs are used separately as needed, such use includes various variations based on various design concepts and specifications, of course. For example, depending on the specification of the on resistance the signal line switch 10 can be composed only of the conventional TFTs.

The various changes and modifications mentioned above are also possible basically in the other embodiments that will be described below, of course.

<Second Embodiment>

Figure 10:
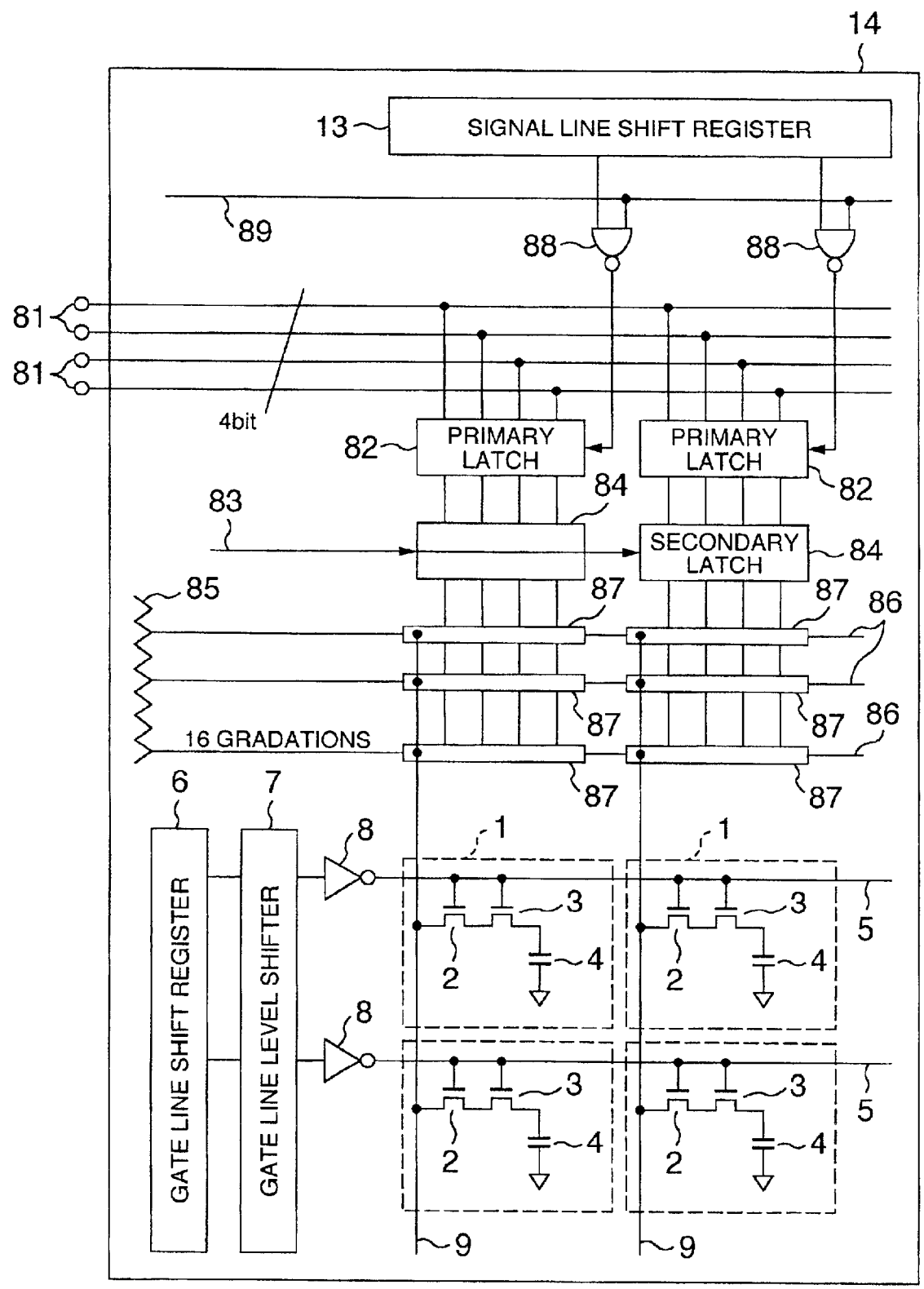
FIG. 10 is a schematic of another embodiment of the image display apparatus according to the present invention.

A second embodiment of the present invention will be described next. FIG. 10 illustrates a polycrystal silicon TFT liquid crystal display panel of the second embodiment. Also, in this embodiment a glass substrate 14 is provided on which pixels 1 each having crystal capacitance 4 are arranged in the form of a matrix as in the first embodiment of FIG. 2 (similarly, for simplifying purposes, only four pixels 1 are illustrated).

The liquid crystal capacitance 4 of the pixels 1 in each column are together connected to a respective signal line 9 via respective pairs of pixel TFTs 2 and 3 of the pixels where the source and drain electrodes of each TFT are connected in series. The respective pixels 1 in each row are connected in parallel to a respective gate line 5 through the gate electrodes of the pair of TFTs 2 and 3 thereof. Each gate line 5 is connected via a relevant gate line buffer 8 and a gate line level shifter 7 to gate line shift register 6.

Thus, this arrangement is similar to that of the FIG. 2 embodiment. Therefore, the gate line shift register 6 sequentially scans the gate lines 5 via the gate line level shifter 7 and the gate line buffers 8 corresponding to the gate lines 5 so that signal voltages distributed sequentially to the respective signal lines 9 are applied to the corresponding liquid crystal capacitance 4 of the pixels 1 to thereby modulate the optical characteristics of the liquid crystals of the respective pixels 1. As a result, an image depending on the input signal voltage is displayed on the whole display panel. This operation is similar to that of the FIG. 2 embodiment.

A so-called reflective display type liquid crystal display apparatus is obtained in which an image is displayed only with the aid of external environmental light without any internal illumination of back or front light by disposing an optical reflective electrode in each of the pixels, as in the embodiment of FIG. 2.

The embodiment of FIG. 10 is different from that of FIG. 2 in the composition of the circuit ranging from the signal lines 9 to the signal line shift register 13, which will be mainly described below.

First, in the embodiment of FIG. 10 the signal line 9 extending from each pixel 1 is connected to respective voltage selectors 87. Outputs from the signal line shift register 13 are connected along with an output of a first latch control line 89 to inputs of corresponding NAND gates 88, the outputs from which control the corresponding first data latches 82.

Four-bit parallel digital data are input via corresponding data input lines 81 to primary data latches 82 and then to secondary data latches 84 controlled by a second latch control line 83. Outputs from the secondary data latches 84 are inputted to voltage selectors 87.

Sixteen reference voltage lines 86 extend from a ladder resistor 85 so that 16 different reference voltages are inputted to the corresponding voltage selectors 87 to modify the respective liquid crystals of the pixels 1 in 16 gradations.

Operation of this embodiment of the display panel 10 will be described next. Each of output signals from the signal line shift register 13 is ANDed together with a signal on the primary latch control line 89 and then delivered to a corresponding primary data latch 82 to thereby distribute 4-bit digital signal data received from the four digital data input lines 81 to the primary data latch 82.

The digital signal data distributed to the corresponding primary data latch 82 is controlled by a signal inputted by the secondary latch control line 83, latched by a secondary data latch 84 driven in a horizontal scan cycle and then inputted to the corresponding voltage selector 87.

The ladder resistor 85 inputs decoded analog voltages via 16 reference voltage lines 86 to corresponding voltage selectors 87, which decode the 4-bit digital signal data using the corresponding reference voltages on the reference voltage lines 86 (D-to-A conversion).

The D-to-A conversion of the voltage selectors 87 is reported, for example, by "ISSCC2000 Digest of technical papers, pp. 188–189 (2000)". Thus, further description of the detailed composition and operation of the voltage sectors will be omitted.

As described above, the 4-bit digital signal data is converted by the voltage selectors 87 to an analog signal voltage, which is then outputted to the signal line 9.

As described above, the gate line shift register 6 sequentially scans the gate lines 5 via the gate line level shifter 7 and the gate line buffers 8 corresponding to the gate lines 5 to open/close the respective pixel TFTs 2 and 3 in the corresponding pixel rows, and inputs signal voltages appearing on the respective signal lines 9 to the corresponding liquid crystal capacitances 4 in the corresponding pixels 1.

The signal voltages inputted to the respective liquid crystal capacitance 4 of the pixels modulate the corresponding optical characteristics of the liquid crystals of the pixels 1. As a result, a picture depending on the inputted signal voltage is displayed.

Thus, a so-called reflective display type liquid crystal display apparatus is obtained in which an image is displayed only with the aid of external environmental light even without any internal illumination of back or front light by disposing an optical reflective electrodes in each of the pixels.

Also in the FIG. 10 embodiment the gate line shift register 6, gate line level shifter 7 and signal line shift register 13 partially employ the bipolar TFTs as in the FIG. 2 embodiment. Thus, this embodiment is sufficiently operable with a low drive voltage, for example, of 5 V to thereby reduce the power consumption greatly.

Since the composition and operation of those circuits are already explained with reference to the FIG. 2 embodiment, further description thereof will be omitted. The compositions of the primary data latch 82 and the secondary data latch 84 that compose the features of the FIG. 10 embodiment will be described next.

Figure 11:
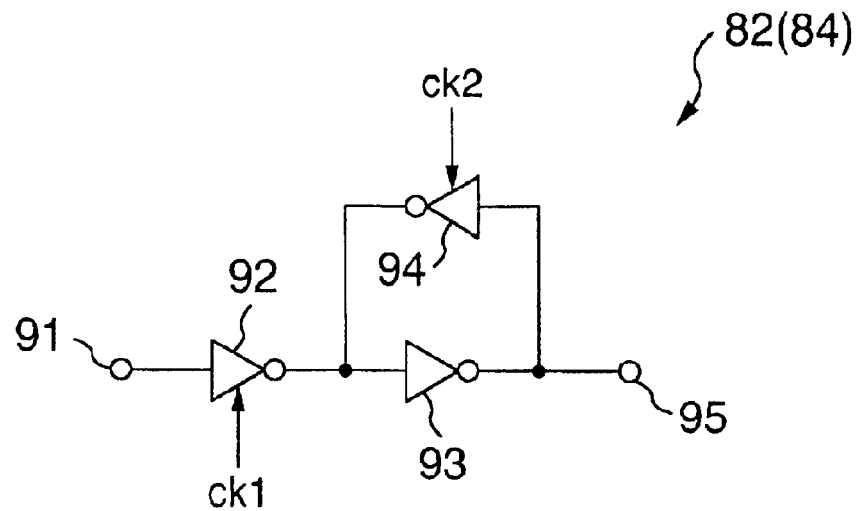
FIG. 11 is a schematic of a latch unit as one embodiment of the present invention.

FIG. 11 is a schematic of one of unit elements composing each of the primary and secondary data latches 82 and 84. An input terminal 91 of the latch unit element is connected to an input of a clocked inverter 92 controlled by a first clock ck1.

The output from the clocked inverter 92 is inputted to a flip-flop composed of an inverter 93 and a clocked inverter 94 that is controlled by a second clock ck2. An output from the flip-flop is connected to an output terminal 95 of the latch unit element. The first and second clocks ck1 and ck2 are in complementary relationship in which when one of the first and second clock voltages is high, the other of the clock voltages is low.

Operation of the latch unit element of FIG. 11 will be described next, which is basically the same as the unit element of the shift register of FIG. 5. When the clocked inverter 92 controlled by the first clock ck1 is turned on, an input signal applied to the input terminal 91 is captured by the flip-flop. When the clocked inverter 94 controlled by the second clock ck2 is turned on, one-bit signal data captured by the flip-flop is latched.

Since this embodiment also uses a bipolar TFT in each of the inverters and the clocked inverters, it is easily operable with a low voltage of less than 5 V, advantageously.

The composition and operation of the latch unit element using the bipolar TFTs are similar to those of the shift register unit of the first embodiment described with reference to FIGS. 6 and 7, and further description thereof will be omitted.

Figure 12:
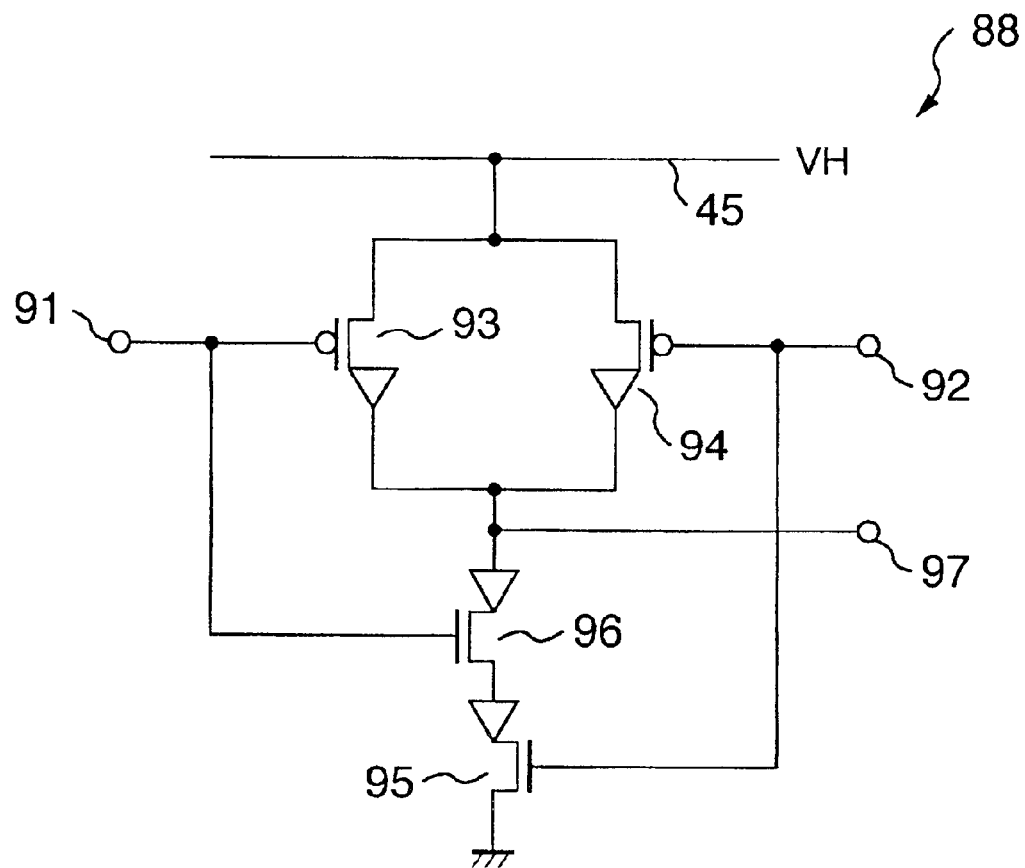
FIG. 12 is a schematic of a NAND gate as one embodiment of the present invention.

The composition of each NAND gate 88 of the FIG. 10 embodiment will be described with reference to FIG. 12. As shown in FIG. 12, NAND gate 88 has a pair of input terminals 91 and 92 and a single output terminal 97. The pair of input terminals 91 and 92 are connected to corresponding gate electrodes of a pair of p-channel bipolar TFTs 93 and 94 whose source terminals are connected together to a power supply voltage line 45.

The other source terminals of those p-channel bipolar TFTs 93 and 94 are grounded via two series connected n-channel bipolar TFTs 96 and 95. The gate electrodes of the n-channel bipolar TFTs 96 and 95 are connected to the input terminals 91 and 92, respectively.

The p- and n-channel bipolar TFTs perform substantially equal operations as p- and n-MOS logic gates, respectively.

Thus, clearly, in the NAND gate 88 an NAND logic involving voltages on the input terminals 91 and 92 is outputted to the output terminal 97. In this respect, even in this case the voltage VH is 5 V and the input logic voltage is 5/0 V.

In the NAND gate 88 the "H" and "L" output voltages are about 4.5 (5−0.5) and 1.0 (0.5+0.5) V, respectively. Thus, the threshold voltages of the primary data latch 82 that receives these output signals are 1.5 and −1.0 V for the n- and p-channels, respectively.

As described above, the amplitude of the output of the bipolar TFT does not reach the full power supply voltage. A conventional TFT may be provided in parallel with the bipolar TFT as needed, as described with respect to the first embodiment.

<Third Embodiment>

A third embodiment of the present invention will be described next. The composition and operation of a polycrystal silicon TFT liquid crystal display panel according to this embodiment are substantially the same as in the first embodiment already described above. Thus, further description thereof will be omitted and the difference of the third embodiment from the first embodiment will be described below.

Figure 13:
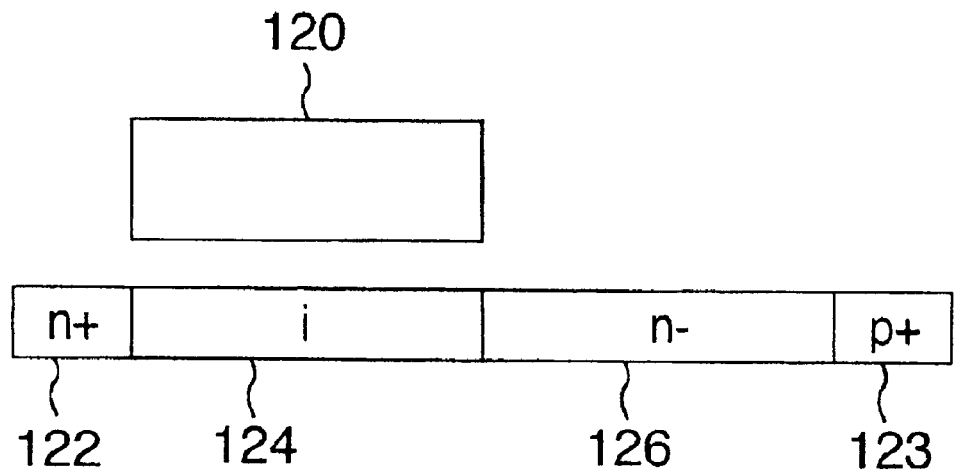
FIG. 13 illustrates a third embodiment of the bipolar TFT according to the present invention.

FIG. 13 illustrates a composition of a bipolar TFT used in the third embodiment and corresponds to the cross-sectional view of FIG. 1A described with reference to the first embodiment. As shown in FIG. 13, the bipolar TFT of the third embodiment has a first source area composed of an $n^+$ high-density impurity injection area 122 (corresponding to 22 in FIG. 1A), a second source area composed of a $p^+$ high-density impurity injection area 123 (corresponding to 23 in FIG. 1A), a channel forming area composed of an i-impurity non-injection area 124 (corresponding to 24 in FIG. 1A), and a gate electrode 120 (corresponding to 20 in FIG. 1A).

Thus, in these respects the embodiment of FIG. 13 is the same as that of FIGS. 1A and 1B. The third embodiment is different from that of FIGS. 1A and 1B in that in addition to the above mentioned composition an $n^-$ lower density impurity injection area 126 is provided in a portion of the channel forming area which does not lap over the gate electrode 120 in FIG. 13. The $n^-$ lower density impurity injection area 126 contains injected P (phosphorus) having a density of 1 $e^-18/cm^3$.

The gate electrode 120 of the bipolar TFT laps over the i-impurity non-injection area 124 in plan so as to be adjacent to the $n^+$ high-density impurity injection area 122 corresponding to one source electrode of the bipolar TFT and is about 4 $\mu$m distant from the $p^+$ high-density impurity injection area 123 corresponding to the other source electrode of the TFT.

Also, here FIG. 13A omits representation of insulators such as $SiO_2$ and $Si_3N_4$ formed between the gate electrode 120 and the i-impurity non-injection area 124 and in other areas, and the underlying glass substrate 14.

By providing such the $n^-$ lower density impurity injection area 126, the bipolar TFT of the third embodiment has a higher current drive capability, thereby ensuring a satisfactory low-voltage operation sufficiently.

When the impurity density of the $n^-$ lower density impurity injection area 126 is much greater than 1 $e^-18/cm^3$, the re-combination rate of holes injected from the $p^+$ high-density impurity injection area 123 becomes too high, so that a quantity of holes injected into the i-impurity non-injection area 124 in the channel forming area becomes very small, undesirably. This is because at this time the bipolar TFT changes, as it were, to a conventional TFT connected to an $n^+p^+$ diode, and the unique advantageous effects of the inventive bipolar TFT produced by injection of the bipolar carriers into the channel forming area is lost.

Although, only the n-channel bipolar TFT has been illustrated here, the $p^-$ lower density impurity injection area may be used similarly for the p-channel bipolar TFT as needed. In addition, any combination of the $n^-$ and $p^-$ lower density impurity injection areas can be provided for the n- and p-channels.

<Fourth Embodiment>

A fourth embodiment of the present invention will be described next. The composition and operation of a polycrystal silicon TFT liquid crystal display panel according to this embodiment are substantially the same as in the first embodiment already described above, and further description thereof will be omitted and the difference of the third embodiment from the first embodiment will be described below.

Figure 14:
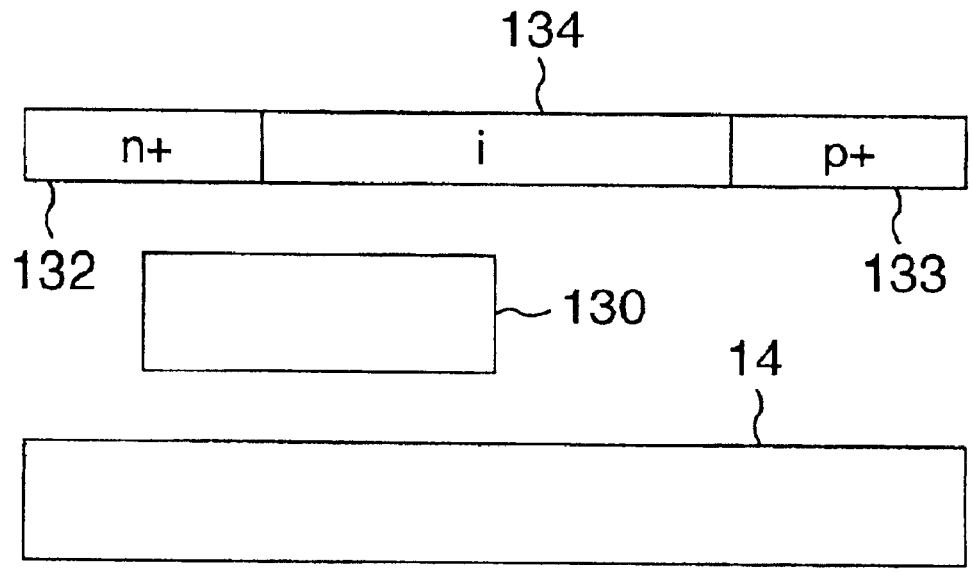
FIG. 14 illustrates a fourth embodiment of the bipolar TFT according to the present invention.

FIG. 14 illustrates a composition of a bipolar TFT used in the fourth embodiment and corresponds to the cross-sectional view of FIG. 1A described with reference to the first embodiment. As shown in FIG. 14, the bipolar TFT of the this embodiment has a first source area composed of an $n^+$ high-density impurity injection area 132 (corresponding to 22 in FIG. 1A), a second source area composed of a $p^+$ high-density impurity injection area 133 (corresponding to 23 in FIG. 1A), a channel forming area composed of an i-impurity non-injection area 134 (corresponding to 24 in FIG. 1A), and a gate electrode 130 (corresponding to 20 in FIG. 1A).

Thus, the fourth embodiment is similar to that of FIGS. 1A and 1B excluding that in the former embodiment the gate electrode 130 is formed between the i-impurity non-injection area 134 and the glass substrate 14.

The gate electrode 130 partially overlaps in plan with the $n^+$ high-density impurity injection area 132 corresponding to the source electrode in addition to the i-impurity non-injection area 134, and is about 4 $\mu$m distant from the $p^+$ high-density impurity injection area 133 corresponding to the other source electrode thereof.

FIG. 14 omits representation of insulators composed of $SiO_2$ and $Si_3N_4$ provided between the gate electrode 130 and each of the $n^+$ high-density impurity injection area 132 and the i-impurity non-injection area 134 and in other areas.

A composition in which a gate electrode is held between a channel forming area and a glass substrate is called a reverse stagger structure and not shown. When the fourth embodiment contains a general TFT used along with the bipolar TFT of FIG. 14, a reverse stagger composition is employed in which the gate electrode of the general TFT is held between the channel forming area and the glass substrate like the bipolar TFT in order to enable a common manufacturing process to be used.

In this case, since the general TFT as well as the bipolar TFT are both arranged to have the reverse stagger composition, the bipolar TFT can be easily manufactured in a process line similar in composition to the conventional amorphous Si-TFT, advantageously.

Thus, according to the fourth embodiment a polycrystal silicon TFT liquid crystal display panel can be easily manufactured without greatly changing the existing amorphous Si-TFT manufacturing line, advantageously.

In the case of the bipolar TFT of this display panel of the fourth embodiment, a new process for exposing the back of the glass substrate 14 to light is needed in order to produce the $n^+$ high-density impurity injection area 132 in structurally self-matching relationship to the gate electrode 130.

In order to avoid a great change in the conventional amorphous Si-TFT manufacturing process in the FIG. 14 bipolar TFT, the $n^+$ high-density impurity injection area 132 was produced in an ion implantation process performing resist mask alignment.

In this case, an offset that may occur between the $n^+$ high-density impurity injection area 132 and the gate electrode 130 should be avoided. To this end, in this embodiment the $n^+$ high-density impurity injection area 132 is disposed so as to overlap with the gate electrode 130 in plan, as described above.

While only the n-channel bipolar TFT has also been described here, a $p^-$, lower density impurity injection area can be used for the p-channel bipolar TFT as needed. In addition, any combination of impurity injection areas having any $n^-$ and $p^-$ lower densities can be made for the n- and p-channels.

<Fifth Embodiment>

A fifth embodiment of the present invention will be described next. The composition and operation of a polycrystal silicon TFT liquid crystal display panel according to this embodiment are substantially the same as in the first embodiment already described above, and further description thereof will be omitted and the difference of the third embodiment from the first embodiment will be described below.

Figure 15:
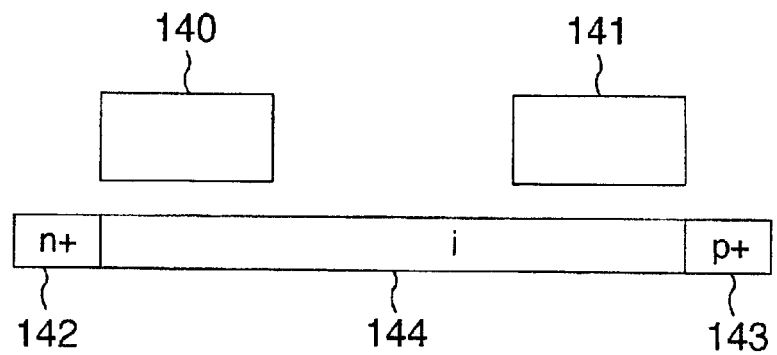
FIG. 15 illustrates a fifth embodiment of the bipolar TFT according to the present invention.

FIG. 15 illustrates a composition of a bipolar TFT used in the fifth embodiment and corresponds to the cross-sectional view of FIG. 1A described with reference to the first embodiment. The bipolar TFT of FIG. 15 has a first source area composed of an $n^+$ high-density impurity injection area 142 (corresponding to 22 in FIG. 1A), a second source area composed of a $p^+$ high-density impurity injection area 143 (corresponding to 23 in FIG. 1A), a channel forming area composed of an i-impurity non-injection area 144 (corresponding to 24 in FIG. 1A), and a gate electrode 140 (corresponding to 20 in FIG. 1A).

Thus, the fifth embodiment is similar to that of FIGS. 1A and 1B except that two gate electrodes 140 and 141 are provided.

One gate electrode 140 is adjacent to the $n^+$ high-density impurity injection area 142 that forms one source whereas the other gate 141 is adjacent to the $p^+$ high-density impurity injection area 143.

FIG. 15 omits representation of insulators composed of $SiO_2$ and $Si_3N_4$ provided between each of the gate electrodes 140 and 141, a corresponding one of the $n^+$ and $p^+$ high-density impurity injection areas 142 and 143, and the i-impurity injection areas 144 and in other areas required.

The bipolar TFT of the FIG. 15 embodiment becomes conductive only when the gate electrode 140 is at a higher voltage level than the $n^+$ high-density impurity injection area 142 and when the gate electrode 141 is at a lower voltage level than the $p^+$ high-density impurity injection area 143. This is because injection of bipolar carriers are needed for operating the bipolar TFT, and in greater detail because when the gate electrode 140 is at a higher voltage than the $n^+$ high-density impurity injection area 142, electrons are injected into the channel forming area 144 and when the gate electrode 141 is at a lower voltage level than the $p^+$ high-density impurity injection area 143, holes are injected into the channel forming area 144.

While in this embodiment the distance between the gate electrodes 140 and 141 is designed so as to be 4 µm, as the distance decreases the current drive capability is increased. Thus, the distance between the gate electrodes 140 and 141 is preferably narrow in terms of this fact.

Actually, the limit of the distance between the gate electrodes 140 and 141 is, however, equal to the minimum processable size of each of the gate electrodes.

In this case, the use of a 2-layered gate electrode enables both the gate electrodes to lay over each other to thereby reduce the distance between the gate electrodes 140 and 141.

Since the bipolar TFT of the FIG. 15 embodiment has the two gate electrodes, the n- and p-channels can be used exchangeable without being distinguished from each other, advantageously.

By providing $n^-$ and $p^-$ areas between the gate electrodes of the bipolar TFT in the FIG. 15 embodiment as described with reference to the third embodiment of FIG. 13, its current drive capability is improved.

<Sixth Embodiment>

Figure 16:
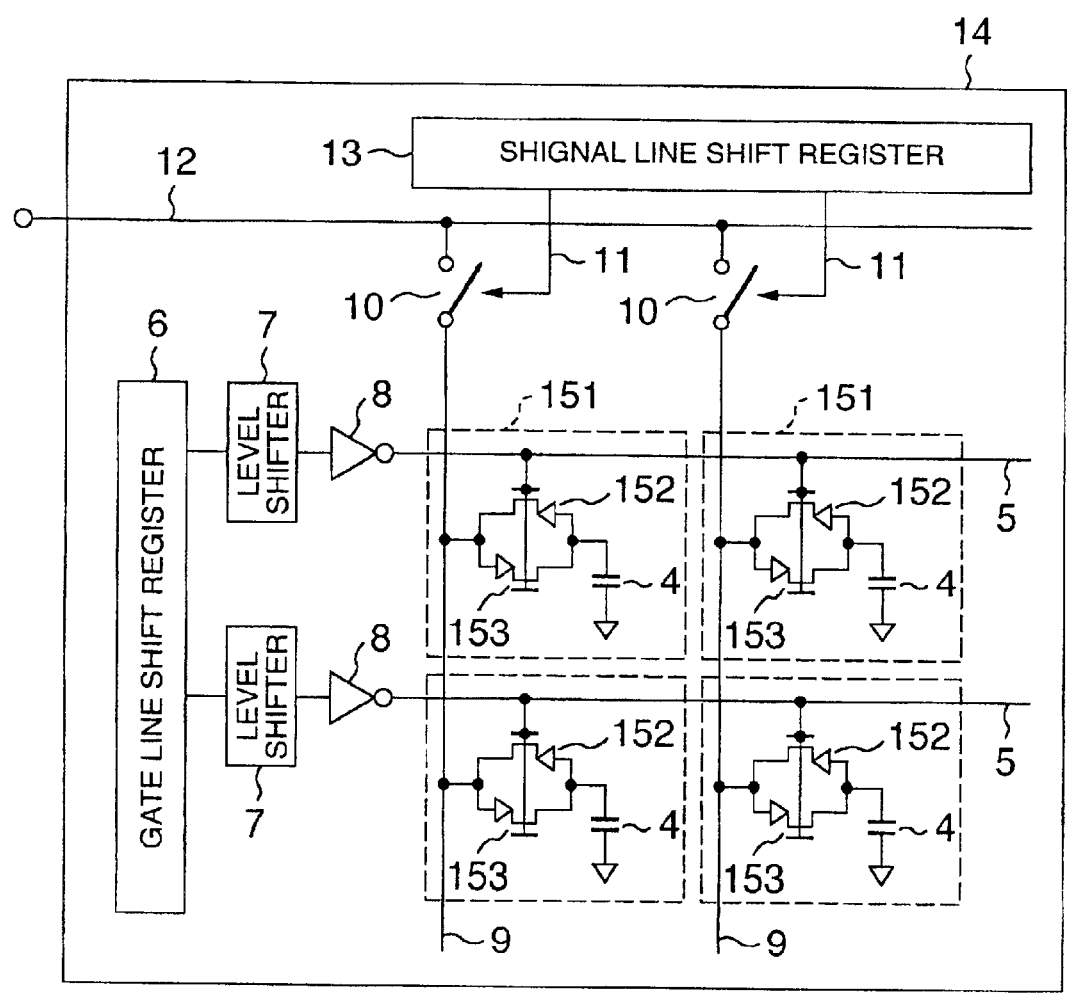
FIG. 16 is a schematic of still another embodiment of the image display apparatus according to the present invention.

A sixth embodiment of the present invention will be described next. FIG. 16 illustrates a polycrystal silicon TFT liquid crystal display panel of the sixth embodiment. As shown, this embodiment also has a glass substrate 14 on which pixels 151 (corresponding to pixels 1 in FIG. 2) each having liquid crystal capacitance 4 are arranged in the form of a matrix (for simplifying purpose, only four pixels 151 are illustrated).

Pixels 151 in a row are connected in parallel with a gate line 5. Pixels 151 in a column are connected in parallel with a corresponding signal line 9. Each gate line 5 is connected via a corresponding gate line buffer 8 and a gate line level shifter 7 to a common gate line shift register 6.

Thus, the composition of FIG. 16 described so far is similar to that of FIG. 2 described above except a composition of each pixel 151. Each pixel 151 has liquid crystal capacitance 4 like each pixel 1 of FIG. 2. In the pixel 151 of this embodiment, each liquid crystal capacitance 4 is connected to a corresponding signal line 9 via a pair of pixel bipolar TFTs 152 and 153 connected in opposite directions in parallel with their gates being connected in common to a corresponding gate line 5. Each gate line 9 is connected to a signal input line 12 via a respective signal line switch 10, which is connected via a corresponding shift register output line 11 to a signal line shift register 13.

Operation of this embodiment will be described next. The signal line shift register 13 sequentially scans the signal line switches 10 via the corresponding shift register output lines 11 to thereby distribute signal voltages outputted from the signal input line 12 to the respective signal lines 9.

The gate line shift register 6 scans the gate lines 5 sequentially via the corresponding gate line level shifter 7 and gate line buffers 8 to thereby open/close the pixel bipolar TFTs 152 and 153 connected to the respective gate lines 5 and hence to sequentially apply signal voltages on the respective signal lines 9 to the liquid crystal capacitance 4 in the corresponding pixels 151.

The signal voltages inputted to the respective liquid crystal capacitance 4 of the pixels 151 modulate the corresponding optical characteristics of the liquid crystals of the pixels 1. As a result, the whole display panel displays an image depending on the input signal voltages.

A so-called reflective display type liquid crystal display apparatus is obtained in which an image is displayed only with the aid of external environmental light even without any illumination of back or front light by disposing an optical reflective electrode in each of the pixels.

According to this embodiment, the drive voltage can be reduced, for example, to 5 V. As a result, the power consumption is greatly reduced because the bipolar TFTs are partially used by the gate line shift register 6, the gate line level shifter 7, the signal line shift register 13 and the signal line switches 10 as in the first embodiment.

The composition and operation of those circuits are similar to those of the first embodiment, and further description thereof will be omitted.

The sixth embodiment of FIG. 16 is different from the first embodiment in the compositions of the pixel bipolar TFTs 152 and 153 of each pixels 151, which will be described next with reference to FIG. 17.

Figure 17:
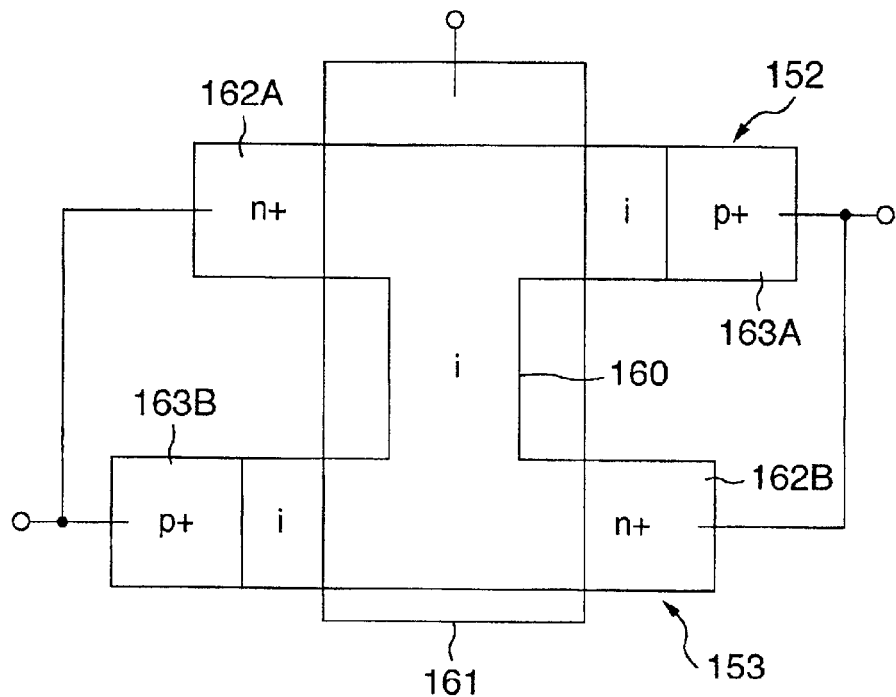
FIG. 17 illustrates a sixth embodiment of the bipolar TFT according to the present invention.

FIG. 17 illustrates a double bipolar TFT device composed of pixel bipolar TFTs 152 and 153, and corresponds to a plan view of FIG. 1B of the first embodiment. In FIG. 17, an i-impurity non-injection area 160 is fallen-sidelong virtually H-type, as shown.

An $n^+$ high-density impurity injection area 162A that will be one source electrode of one pixel bipolar TFT 152 is provided at one or left end of an upper horizontal strip of the fallen-sidelong H whereas a $p^+$ high-density impurity injection area 163A that will be the other source electrode of the pixel bipolar TFT 152 is provided at the other or right end of the upper strip of the H.

Similarly, a $p^+$ high-density impurity injection area 163B that will be one source electrode of the other pixel bipolar TFT 153 is provided at one or left end of an lower horizontal strip of the fallen-side long H whereas an $n^+$ high-density impurity injection area 162B that will be the other source electrode of the pixel bipolar TFT 153 is provided at the other or right end of the lower strip of the fallen-sidelong H.

As shown, a common gate electrode 161 is provided so as to overlap with the i-area 160 in plan to thereby cover the upper and lower strips and a central link of the fallen-sidelong H that combines the upper and lower strips of the fallen-sidelong H. Also, in this case representation of insulators such as $SiO_2$ and $Si_3N_4$ is not shown.

In summary, in the FIG. 17 embodiment the i-impurity non-injection areas for the two upper and lower oppositely arranged n-channel bipolar TFTs 152 and 153 each having the same composition as the bipolar TFT of the embodiment of FIGS. 1A and 1B are connected by a central link portion thereof under the common gate electrode 161.

As a result, when a control voltage is applied to the common gate electrode 161 one of the n-channel bipolar TFTs 152 and 153 is turned on depending on the relationship in voltage between its source electrodes to thereby cause the signal line 9 to write charges into the corresponding liquid crystal capacitance 4.

Also, when the voltage between both the source electrodes of each of the n-channel bipolar TFTs 152 and 153 becomes less than 0.5 V, the resistance between the source electrodes of the TFT increases rapidly, as described with reference to the first embodiment.

In the bipolar TFTs 152 and 153 of the FIG. 17 embodiment, the first source area of the bipolar TFT 152, the i-impurity non-injection area 160 and the first source area of the bipolar TFT 153 cooperate to partially function as a general n-channel TFT switch.

As a result, when the voltage between both the source areas is less than 0.5 V, writing of charges from the signal line 9 into the liquid crystal capacitance 4 by the n-channel TFT switch continues until the voltage across the liquid crystal capacitance 4 becomes equal to that of the signal line 9 finally. Thus, according to this embodiment the power supply voltage is effectively used by each pixel 151.

Therefore, use of the pixel bipolar TFTs 152 and 153 of the sixth embodiment enables high-speed charge writing into the liquid crystal capacitance 4 to thereby easily maintain a rapidly changing image at high definition.

In the sixth embodiment, an optical leak current that may flow through each of the bipolar TFTs 152 and 153 is negligible, advantageously, because the optical reflective electrode disposed for each pixel 151 plays a role as a light shielding layer for the TFTs.

Although omitted, also in this embodiment an electric field produced at an end of the gate electrode of each of the TFTs 152 and 153 can be alleviated using a low-density impurity injection area formed between the first source area and the gate electrode to reduce a leak current produced in the TFT when turned off, as performed in the conventional TFT.

In the above respective embodiments, the liquid crystal display panels were illustrated. However, since the present invention also relates to the field effect transistors drivable at low voltage, the image display techniques are obviously not limited to the liquid crystal display ones. For example, as image display techniques necessary for forming low-cost field effect transistors on an insulator substrate, for example, OLED (Organic Light Emitting Diode) display techniques could be named.

<Seventh Embodiment>

Figure 18:
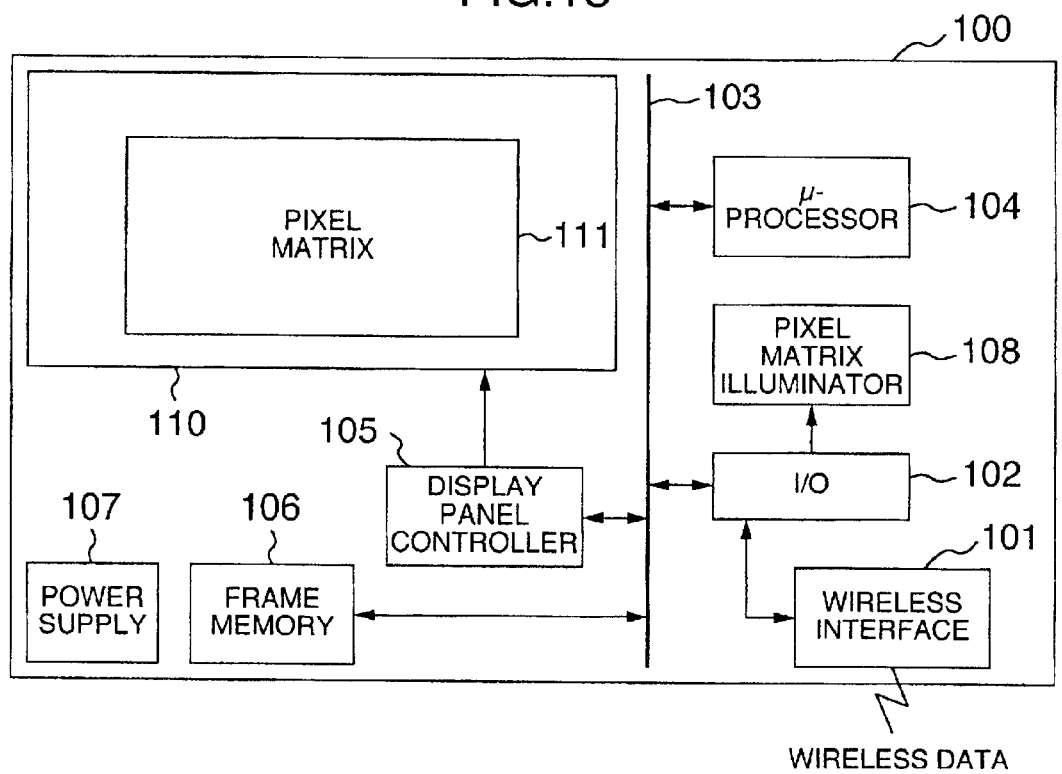
FIG. 18 is a schematic of a further embodiment of the image display apparatus according to the present invention.
Figure 19:
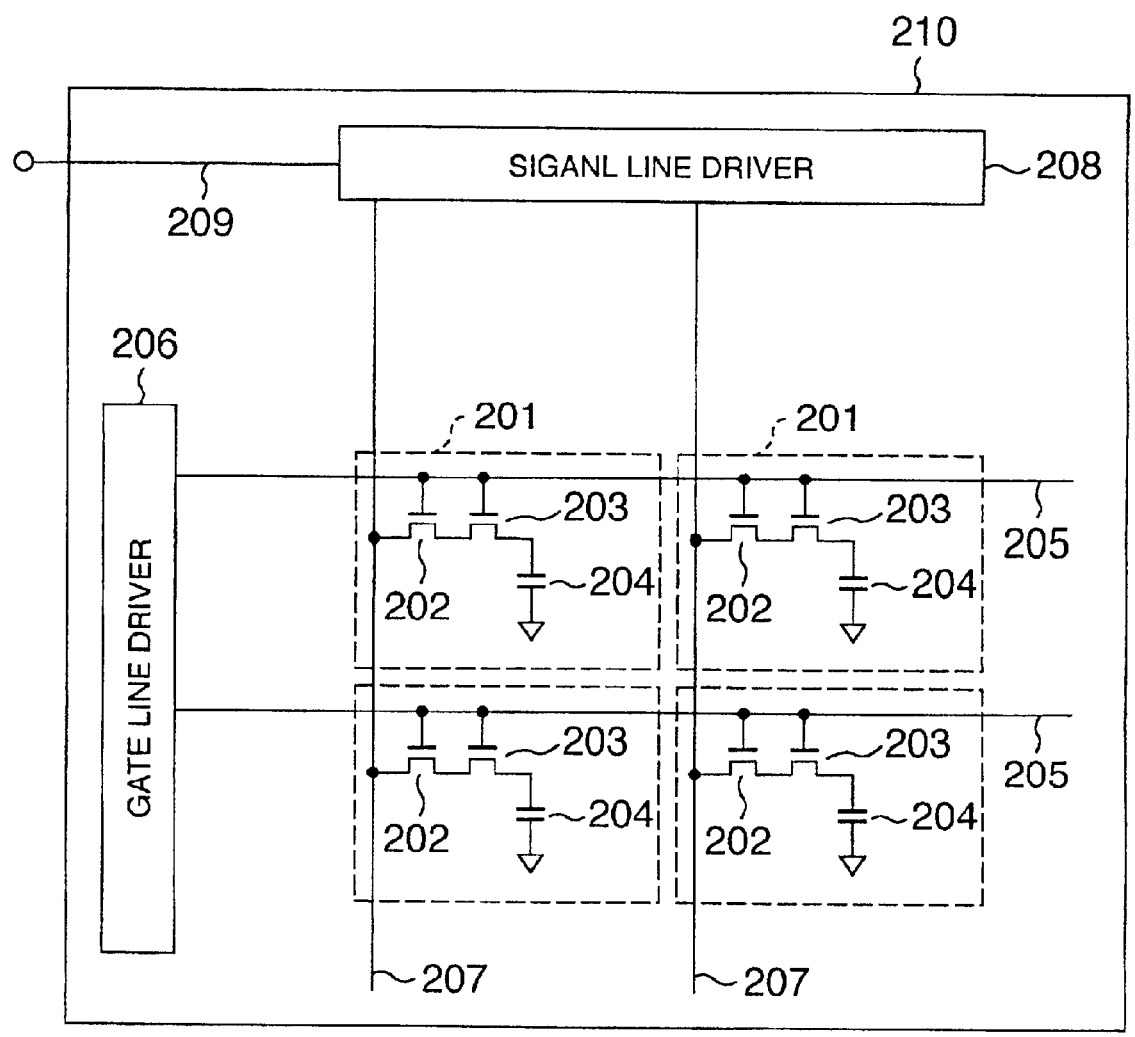
FIG. 19 is a schematic of a TFT liquid crystal panel according to the related art.
Figure 20A:
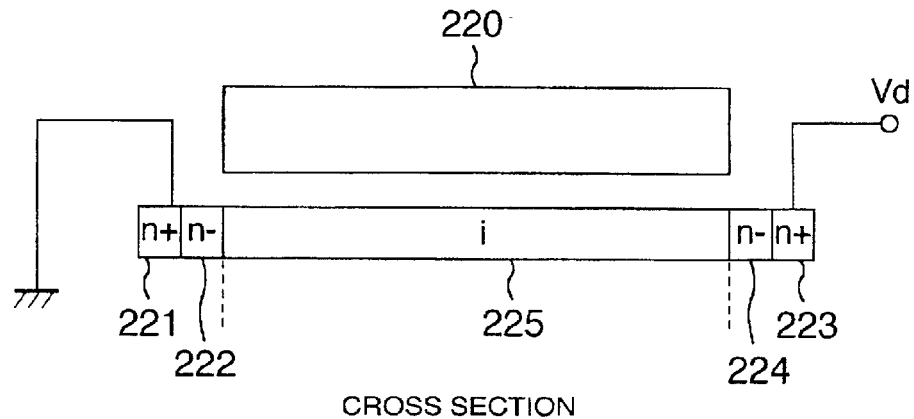
FIGS. 20A, 20B and 20C illustrate operation of the TFT according to the related art.
Figure 20B:
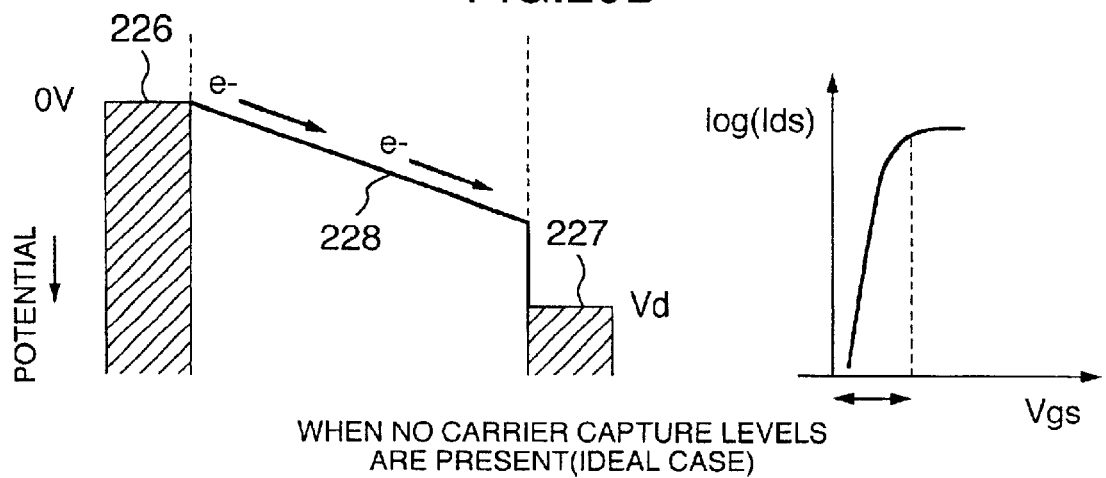
Figure 20C:
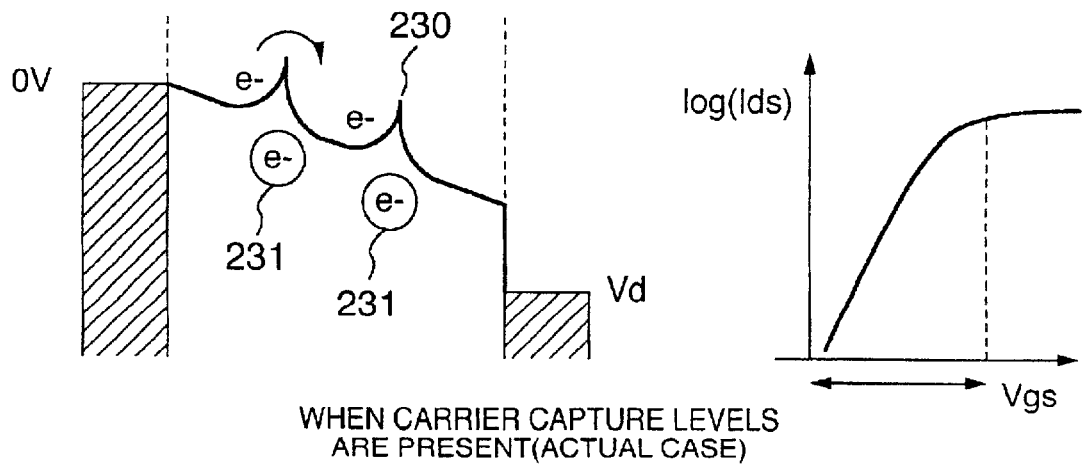

Referring to FIG. 18, a seventh embodiment of the present invention will be described next which is applied to image display terminals (PDA: Personal Digital Assistants) 100.

Compressed image data is inputted externally, for example, as wireless data based on Bluetooth standards to a wireless interface (I/F) circuit 101 whose output is connected via an I/O (Input/Output) circuit 102 to a data bus 103, which is also connected to a microprocessor 104, a display panel controller 105 and a frame memory 106.

An output from the display panel controller 105 is inputted to a reflection/transmission display polysilicon TFT liquid crystal display panel 110 which has a pixel matrix 111.

The image display terminal 100 further comprises a power supply 107 and a pixel matrix illuminator 108, which is controlled by the I/O circuit 102.

The display panel 110 has the same composition and operation as the first embodiment described above and further description of the internal composition and operation thereof will be omitted herein.

Operation of the PDA of the seventh embodiment will be described next. First, the wireless I/O circuit 101 externally receives compressed image data in accordance with a command, and transfers this data via the I/O circuit 102 to the microprocessor 104 and the frame memory 106.

The microprocessor 104 drives the image display terminal 100, decodes the compressed image data, processes the signals, and display the information in accordance with commands from the user.

At this time, the processed image data is stored temporarily in the frame memory 106.

The frame memory 106 is controlled in accordance with a command from the microprocessor 104 to thereby input image data from the frame memory 106 via the display panel controller 105 to the display panel 110. Thus, the pixel matrix 111 displays the inputted image data.

At this time, the display panel controller 105 simultaneously outputs a predetermined timing pulse necessary for displaying the image.

At this time, the I/O circuit 102 can light up the pixel matrix illuminator 108 in accordance with a command from the microprocessor 104.

The power supply 107 comprises a lithium ion secondary battery that supplies the relevant elements of the whole image display terminal 100 with power necessary to drive the image display terminal 100.

As described above, the display panel 110 of this embodiment is drivable at a low voltage of 5 V. Thus, the input voltage to the panel 110 only needs a 7.2 V power supply obtained easily only by connecting two 3.6 V lithium ion secondary batteries in series. Thus, according to this embodiment the composition of the image display terminal 100 is simplified to reduce the cost and power consumption simultaneously.

What is claimed is:

1. An insulated gate field effect transistor having a gate electrode overlapping a channel area between a first conductivity type source area and a second conductivity type source area thereof, wherein:

said channel area provides a single channel between said first and second conductivity type source areas and includes a non-overlapped area portion free from being overlapped by the gate electrode in plan, wherein:

said channel area is comprised of a polycrystal silicon film.

2. The field effect transistor according to claim 1, wherein:

the non-overlapped area portion of said channel area has a length longer than a crystal grain size of the polycrystal silicon that comprises said channel area.

3. An insulated gate field effect transistor having a gate electrode overlapping a channel area between a first conductivity type source area and a second conductivity type source area thereof, wherein:

said channel area provides a single channel between said first and second conductivity type source areas and includes a non-overlapped area portion free from being overlapped by the gate electrode in plan, wherein:

said channel area is comprised of an intrinsic semiconductor.

4. The field effect transistor according to claim 3, wherein:

the non-overlapped area portion of said channel area contains injected impurities of less than 1 e−18/cm3.

5. An insulated gate field effect transistor having a oate electrode overlapping a channel area between a first conductivity type source area and a second conductivity type source area thereof, wherein:

said channel area provides a single channel between said first and second source areas and said gate electrode comprises two separate subgate electrodes disposed on respective sides of said first and second conductivity type source areas in a direction in which said channel area extends, wherein:

said channel area is comprised of an intrinsic semiconductor.

6. The field effect transistor according to claim 5, wherein:

the channel area includes a non-overlapped area portion free from being overlapped by the gate electrode in plan and the area portion of said channel area contains injected impurities of less than 1 e−18/cm3.

7. A double field effect transistor device of an insulated gate type, comprising:

a channel area taking a virtually H-type form in plan;

a first pair of source areas different in conductivity type from one another respectively formed at opposite ends of one of a pair of parallel strips that comprises a part of the H, wherein a first single channel is provided in said channel area coupling between both of said first pair of source areas;

a second pair of source areas different in conductivity type from one another respectively formed at opposite ends of the other of said pair of parallel strips that comprises a part of the H so that the source areas formed respectively at the ends of said pair of parallel strips extending in the same direction are different in conductivity type, wherein a second single channel is provided in said channel area coupling between both of said second pair of source areas; and a gate electrode lapping over an area of the H that comprises the central portions of said pair of parallel strips that comprises a part of the H and a central link of the H that combines said pair of parallel strips.

8. The field effect transistor according to claim 7, wherein:

said channel area is comprised of an intrinsic semiconductor.

9. The field effect transistor according to claim 8, wherein:

the channel area includes a non-overlapped area portion free from being overlapped by the gate electrode in plan and the area portion of said channel area contains injected impurities of less than 1 e−18/cm3.

10. An image display apparatus comprising a display unit of a plurality of pixels formed on an insulating substrate, and a controller formed on the insulating substrate for at least processing a display signal and for writing the display signal to said display unit, wherein:

at least part of said controller is comprised of an insulated gate type field effect transistor having a gate electrode overlapping a channel area between a first conductivity type source area and a second conductivity type source area thereof; and said channel area includes a non-overlapped area portion free from being overlapped by the gate electrode in plan.

11. An image display apparatus comprising a display unit of a plurality of pixels formed on an insulating substrate, and a controller formed on the insulating substrate for at least processing a display signal and for writing the display signal to said display unit, wherein:

at least part of said controller is comprised of an insulated gate type field effect transistor having a gate electrode overlapping a channel area between a first conductivity type source area and a second conductivity source area thereof; and said channel area includes a non-overlapped area portion free from being overlapped by the gate electrode in plan; and said apparatus comprising:

an image control unit of said display unit being of an insulated gate type, said image control unit comprising:

a channel area taking a virtually H-type form;

a first pair of source areas different in conductivity type from one another respectively formed at opposite ends of one of a pair of parallel strips that comprises a part of the H, wherein a first single channel is provided in said channel area coupling between both of said first pair of source areas;

a second pair of source areas different in conductivity type from one another respectively formed at opposite ends of the other of said pair of parallel strips that comprises a part of the H so that the source areas formed respectively at the ends of said pair of parallel strips extending in the same direction are different in conductivity type, wherein a second single channel is provided in said channel area coupling between both of said second pair of source areas; and a gate electrode lapping over an area of the H that comprises the central portions of said pair of parallel strips that comprises a part of the H and a central link of the H that combines said pair of parallel strips.

12. An insulated gate field effect transistor having a gate electrode overlapping a channel area between a first conductivity type source area and a second conductivity type source area thereof, wherein:

said channel area comprises an area portion free from being overlapped by the gate electrode in plan, wherein said channel area is comprised of a polycrystal silicon film, and wherein the non-overlapped area portion of said channel area has a length longer than a crystal grain size of the polycrystal silicon that comprises said channel area.

13. An insulated gate type field effect transistor having a gate electrode overlapping a channel area between a first conductivity type source area and a second conductivity type source area thereof, wherein:

said gate electrode comprises two separate subgate electrodes disposed on respective sides of said first and second conductivity type source areas in a direction in which said channel area extends, and said channel area is comprised of an intrinsic semiconductor.

14. The field effect transistor according to claim 13, wherein:

the channel area includes a non-overlapped area portion free from being overlapped by the gate electrode in plan and the area portion of said channel area contains injected impurities of less than 1 e−18/cm3.

15. A double field effect transistor device of an insulated gate type, comprising:

a channel area taking a virtually H-type form in plan;

a first pair of source areas different in conductivity type from one another respectively formed at opposite ends of one of a pair of parallel strips that comprises a part of the H;

a second pair of source areas different in conductivity type from one another respectively formed at opposite ends of the other of said pair of parallel strips that comprises a part of the H so that the source areas formed respectively at the ends of said pair of parallel strips extending in the same direction are different in conductivity type; and a gate electrode lapping over an area of the H that comprises the central portions of said pair of parallel strips that comprises a part of the H and a central link of the H that combines said pair of parallel strips.

16. The field effect transistor according to claim 15, wherein:

said channel area is comprised of an intrinsic semiconductor.

17. The field effect transistor according to claim 16, wherein:

the channel area includes a non-overlapped area portion free from being overlapped by the gate electrode in plan and the area portion of said channel area contains injected impurities of less than 1 e−18/cm3.

18. An image display apparatus comprising a display unit of a plurality of pixels formed on an insulating substrate, and a controller formed on the insulating substrate for at least processing a display signal and for writing the display signal to said display unit, wherein:

at least part of said controller is comprised of an insulated gate type field effect transistor having a gate electrode overlapping a channel area between a first conductivity type source area and a second conductivity source area thereof; and said channel area includes a non-overlapped area portion free from being overlapped by the gate electrode in plan; and said apparatus comprising:

an image control unit of said display unit being of an insulated gate type, said image control unit comprising:

a channel area taking a virtually H-type form;

a first pair of source areas different in conductivity type from one another respectively formed at opposite ends of one of a pair of parallel strips that comprises a part of the H;

a second pair of source areas different in conductivity type from one another respectively formed at opposite ends of the other of said pair of parallel strips that comprises a part of the H so that the source areas formed respectively at the ends of said pair of parallel strips extending in the same direction are different in conductivity type; and a gate electrode lapping over an area of the H that comprises the central portions of said pair of parallel strips that comprises a part of the H and a central link of the H that combines said pair of parallel strips.

* * * * *